(12) United States Patent
Kuo et al.

(10) Patent No.: US 12,431,444 B2
(45) Date of Patent: Sep. 30, 2025

(54) PACKAGE STRUCTURE HAVING TRENCH CAPACITOR

(71) Applicant: Taiwan Semiconductor Manufacturing Company, Ltd., Hsinchu (TW)

(72) Inventors: Fu-Chiang Kuo, Hsinchu (TW); Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 561 days.

(21) Appl. No.: 17/862,267

(22) Filed: Jul. 11, 2022

(65) Prior Publication Data

US 2023/0010825 A1    Jan. 12, 2023

Related U.S. Application Data

(60) Provisional application No. 63/222,459, filed on Jul. 16, 2021, provisional application No. 63/220,431, filed on Jul. 9, 2021.

(51) Int. Cl.
| | | |
|---|---|---|
| *H01L 23/64* | (2006.01) | |
| *H01L 23/498* | (2006.01) | |
| *H01L 25/065* | (2023.01) | |
| *H01L 23/00* | (2006.01) | |

(52) U.S. Cl.
CPC ...... *H01L 23/642* (2013.01); *H01L 23/49816* (2013.01); *H01L 23/49822* (2013.01); *H01L 23/49833* (2013.01); *H01L 23/49838* (2013.01); *H01L 25/0652* (2013.01); *H01L 24/08* (2013.01); *H01L 24/16* (2013.01); *H01L 2224/08145* (2013.01);
(Continued)

(58) Field of Classification Search
CPC ............. H01L 23/642; H01L 23/49816; H01L 23/49822; H01L 23/49833; H01L 23/49838; H01L 25/0652; H01L 24/08; H01L 24/16
See application file for complete search history.

(56) References Cited

U.S. PATENT DOCUMENTS

| | | | |
|---|---|---|---|
| 9,608,130 B2 * | 3/2017 | Tran | H01L 28/91 |
| 10,276,651 B2 * | 4/2019 | Lin | H01L 21/31053 |
| 10,546,917 B1 * | 1/2020 | Tsai | H01L 21/3083 |

(Continued)

*Primary Examiner* — Nathan W Ha
(74) *Attorney, Agent, or Firm* — JCIPRNET

(57) ABSTRACT

A semiconductor structure comprises a semiconductor substrate, a first trench capacitor, and a second trench capacitor. The substrate has first trenches arranged in a first arrangement direction with each first trench extending in a first extension direction and second trenches arranged in a second arrangement direction with each second trench extending in a second extension direction. The first trench capacitor includes first capacitor segments disposed inside the first trenches. The second trench capacitor includes second capacitor segments disposed inside the second trenches. One first capacitor segment of the first capacitor segments has an extending length different from that of another first capacitor segment of the first capacitor segments, and one second capacitor segment of the second capacitor segments has an extending length different from that of another second capacitor segment of the second capacitor segments.

20 Claims, 25 Drawing Sheets

(52) U.S. Cl.
CPC ............... *H01L 2224/16225* (2013.01); *H01L 2924/3511* (2013.01); *H01L 2924/3512* (2013.01)

(56) References Cited

U.S. PATENT DOCUMENTS

| | | | |
|---|---|---|---|
| 2019/0074349 A1* | 3/2019 | Lin | H01L 21/31053 |
| 2020/0066922 A1* | 2/2020 | Cheng | H01L 27/016 |
| 2021/0074806 A1* | 3/2021 | Tsai | H01L 21/308 |
| 2021/0091171 A1* | 3/2021 | Higuchi | H01G 4/30 |
| 2021/0104598 A1* | 4/2021 | Lin | H01L 29/945 |
| 2022/0216253 A1* | 7/2022 | Brady | H04N 25/77 |

* cited by examiner

PACKAGE STRUCTURE HAVING TRENCH CAPACITOR

CROSS-REFERENCE

This application claims the priority benefit of U.S. Provisional Application No. 63/220,431, filed on Jul. 9, 2021, and U.S. Provisional Application No. 63/222,459, filed on Jul. 16, 2021, the contents of which are incorporated herein by reference in their entirety.

BACKGROUND

An integrated circuit includes a plurality of active components and passive components interconnected based on actual design requirements. As the demand for shrinking electronic devices has grown, warpage management is playing an increasingly more important role in the improvement of the performance of the integrated circuits. The warpage management is one of the factors in the performance improvement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
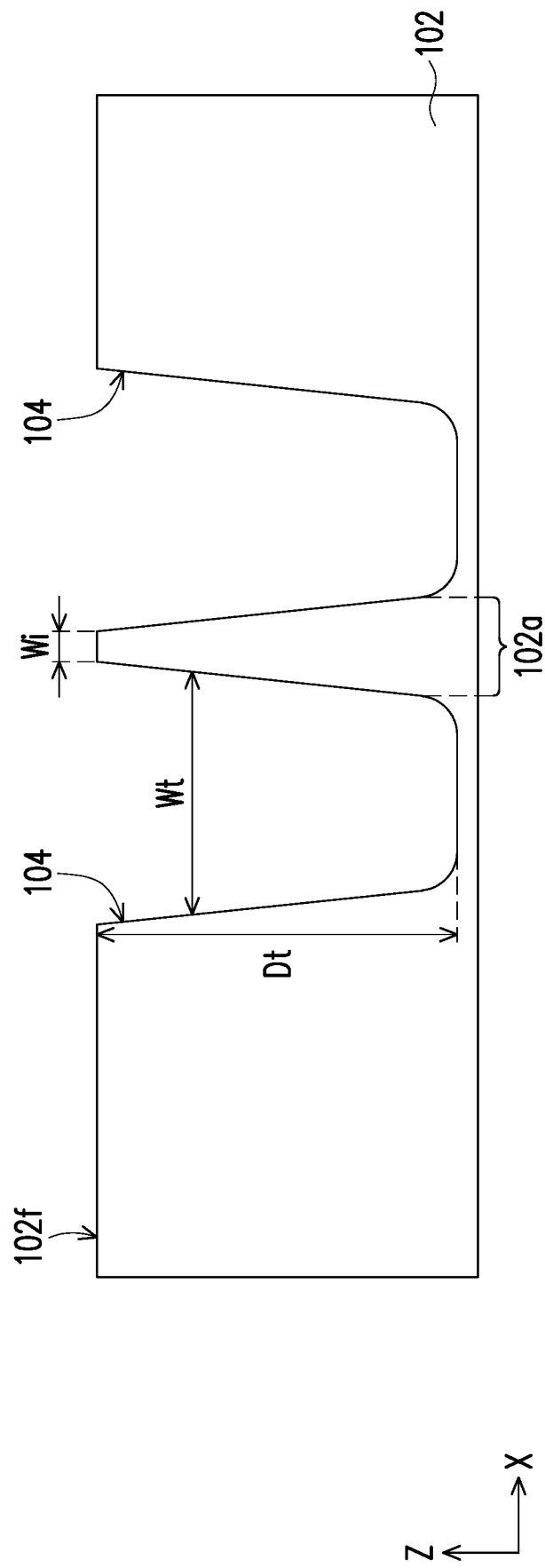
FIGS. 1A-1G are schematic cross-sectional views illustrating various stages of the process steps of a method for fabricating a trench capacitor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Packages of integrated circuit chips may include multiple semiconductor components such as a trench capacitor disposed within and/or over a semiconductor substrate. In accordance with some embodiments of the present disclosure, the semiconductor substrate may have at least two groups of trenches therein, wherein a group of trenches are arranged in parallel in an arrangement direction with each trench extending in an extension direction. In some embodiments, the arrangement directions or extension directions of any two groups of trenches are intersected. Trench capacitors are respectively disposed in a corresponding group of trenches and on the semiconductor substrate. Each trench capacitor includes capacitor segments disposed inside the corresponding group of trenches and extending inside the semiconductor substrate in a corresponding extension direction. One of the capacitor segments has an extending length different from that of another of the capacitor segments. Through the layout design and the arrangement of the capacitor segments, mechanical stress in the semiconductor substrate may be relieved, less cracking occurs in the semiconductor substrate and warpage of the package structure is improved. Further, higher integration density can be achieved and larger capacitance is offered through the compact layout design of the trench capacitor(s), leading to better device performance. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements.

FIGS. 1A-1G are schematic cross-sectional views illustrating various stages of the process steps of a method for fabricating trench capacitors in accordance with some embodiments of the present disclosure. FIG. 2 is a schematic three-dimensional view showing the structure of trench capacitors in accordance with some embodiments. The structures shown in FIGS. 1A-1G, and FIG. 2 are described with reference to a manufacturing method, and it will be appreciated that the structures shown are not limited to the method but rather may stand alone separate of the method. FIGS. 1A-1G illustrate a portion of a trench capacitor in a unit cell, and FIG. 2 is directed to an embodiment of the trench capacitor in the unit cell. However, the described manufacturing method can be used to form embodiments of trench capacitors in multiple unit cells or any number of unit cells. Furthermore, although FIGS. 1A-1G, and 2 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 2:
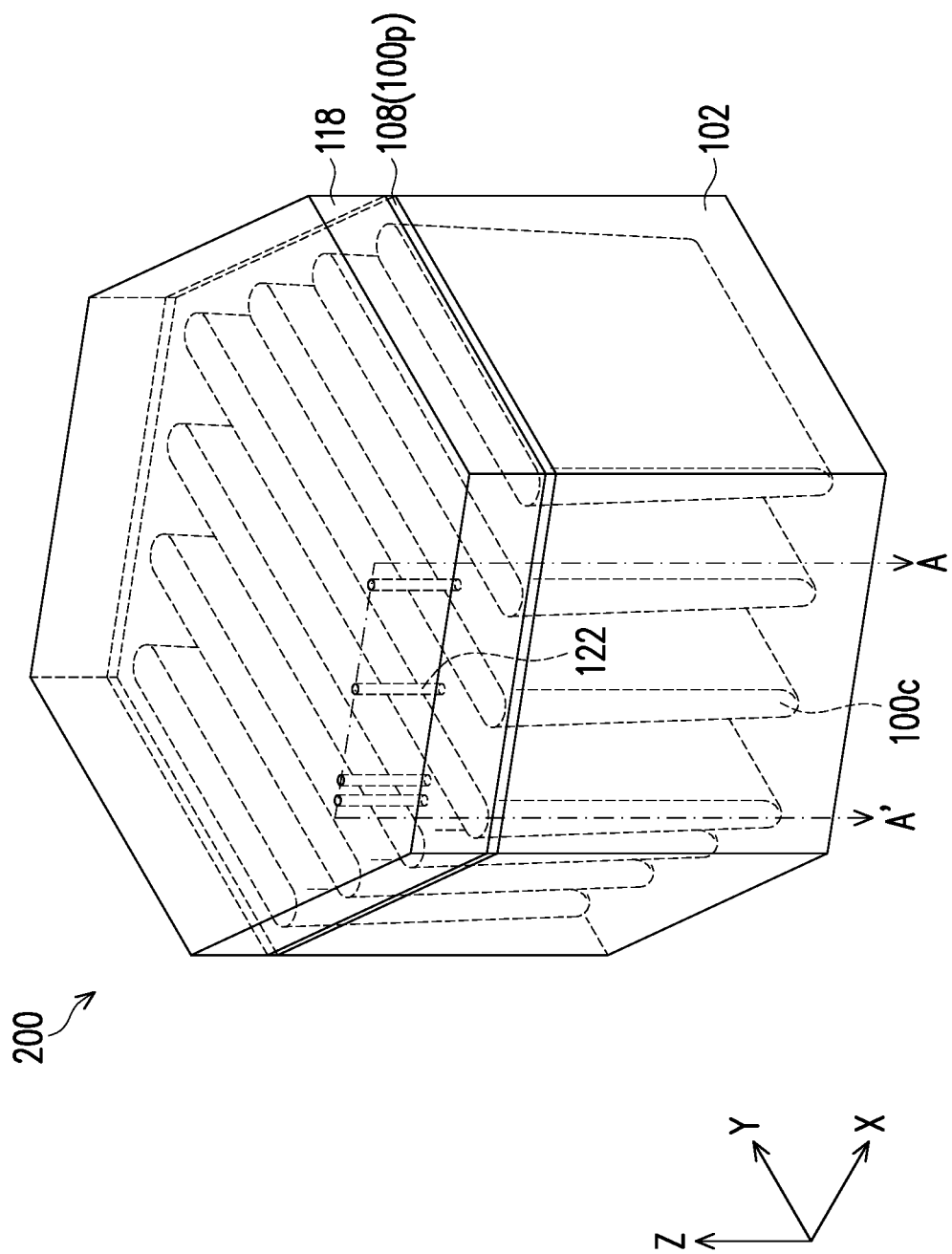
FIG. 2 is a schematic view showing a portion of a trench capacitor in accordance with some embodiments.

Referring to FIG. 1A, a semiconductor substrate 102 of an integrated chip is patterned to form a plurality of trenches 104 (only two trenches are shown) and a substrate segment 102a defined between the trenches 104. In some embodiments, the trenches 104 are separate trenches and are disconnected outside the cross-sectional view of FIG. 1A and may be regarded as independent trenches. In one embodiment, the individual trenches 104 are strip shaped trenches arranged in parallel to one another. In some embodiments, the semiconductor substrate 102 includes a bulk semiconductor substrate, for example, a bulk silicon substrate, a semiconductor-on-insulator (SOI) substrate, a bulk oxide substrate, or some other suitable type of substrate. In other embodiments, the trenches 104 are connected outside the cross-sectional view of FIG. 1A and may be regarded as portions of a common trench. In some embodiments, the formation of the trenches involves performing a patterning process to the semiconductor substrate 102. For example, after forming a hard mask (not shown) over the semiconductor substrate 102, performing an etching process to the semiconductor substrate 102 using the hard mask as an etching mask to form trenches in the semiconductor substrate 102. Later, the hard mask is removed.

In some embodiments, the trenches 104 are arranged in parallel along the X-direction (the arrangement direction), and the trenches 104 are spaced apart and laterally separated with an interval Wi along the X-direction. The interval Wi of the trenches 104 is, for example, greater than about 0.1 micrometers. In some embodiments, the trenches 104 extend into the semiconductor substrate 102 with a depth Dt (along the Z-direction) ranging from about 6 micrometers to 15 micrometers, or some other suitable value(s). As seen in FIG. 1A, the substrate segment 102a is located between the trenches 104 to separate the two most adjacent trenches 104. That is, the two trenches 104 in each pair of neighboring trenches are separated by a corresponding substrate segment 102a.

In some embodiments, as seen in FIG. 1A, the trenches 104 extend downwardly from a front-side surface 102f of the semiconductor substrate 102 into the semiconductor substrate 102 without penetrating through the semiconductor substrate 102. In some embodiments, as seen in FIG. 1A, the trenches 104 are shown to have slant sidewalls and have a trapezoid profile with an oblique angle in the cross-sectional view. In other embodiments, the trenches 104 have substantially vertical sidewalls and have a rectangular profile in the cross-sectional view. In some embodiments, the trenches 104 are formed with a trench width Wt ranging from about 0.1 microns to about 0.2 microns. Further, the trenches 104 respectively have a high aspect ratio. The aspect ratio of the trenches 104 is, for example, greater than or equal to about 1. In some embodiments, the aspect ratio of the trenches 104 is within a range of about 2 to 1000, about 10 to 1000, about 100 to 500, or some other suitable value(s). In various embodiments, the aspect ratio of the trenches 104 is, for example, not less than 5. For a trench with a high aspect ratio, it is understood that the width at a top of the trench may be slightly larger than that at a bottom of the trench.

Figures 3A, 3B:
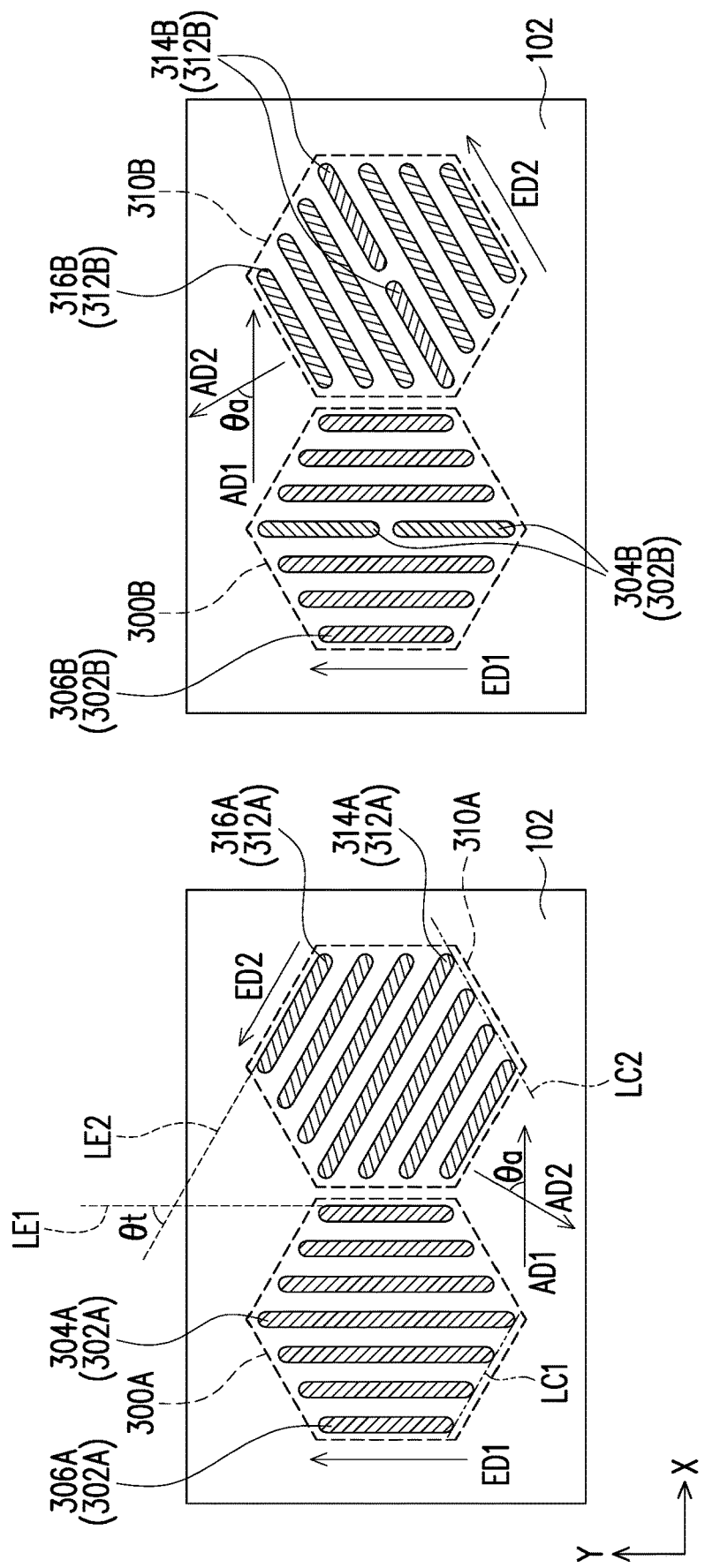
FIGS. 3A-3C, 4, 5, 6A-6B, 7, 8A-8B, 9, and 10A-10B illustrate layout arrangements of capacitor segments of a trench capacitor in accordance with some embodiments.

In some embodiments, a possible layout of the trenches 104 may be shown as in any of FIGS. 3A-3C, 4, 5, 6A-6B, 7, 8A-8B, 9, 10A-10B, 13A-13B, 14, and 15A-15C, as will be described later in the following paragraphs. As should be appreciated, capacitor segments of the trench capacitor formed in the trenches correspond to the profiles of the trenches and may be shown to illustrate the layout of the trench capacitor in FIGS. 3A-3C, 4, 5, 6A-6B, 7, 8A-8B, 9, 10A-10B, 13A-13B, 14, and 15A-15C. In one embodiment, the layout of the trenches 104 may include a plurality of parallel strip shaped trenches similar to the capacitor segments as shown in FIG. 3A.

Figure 1B:
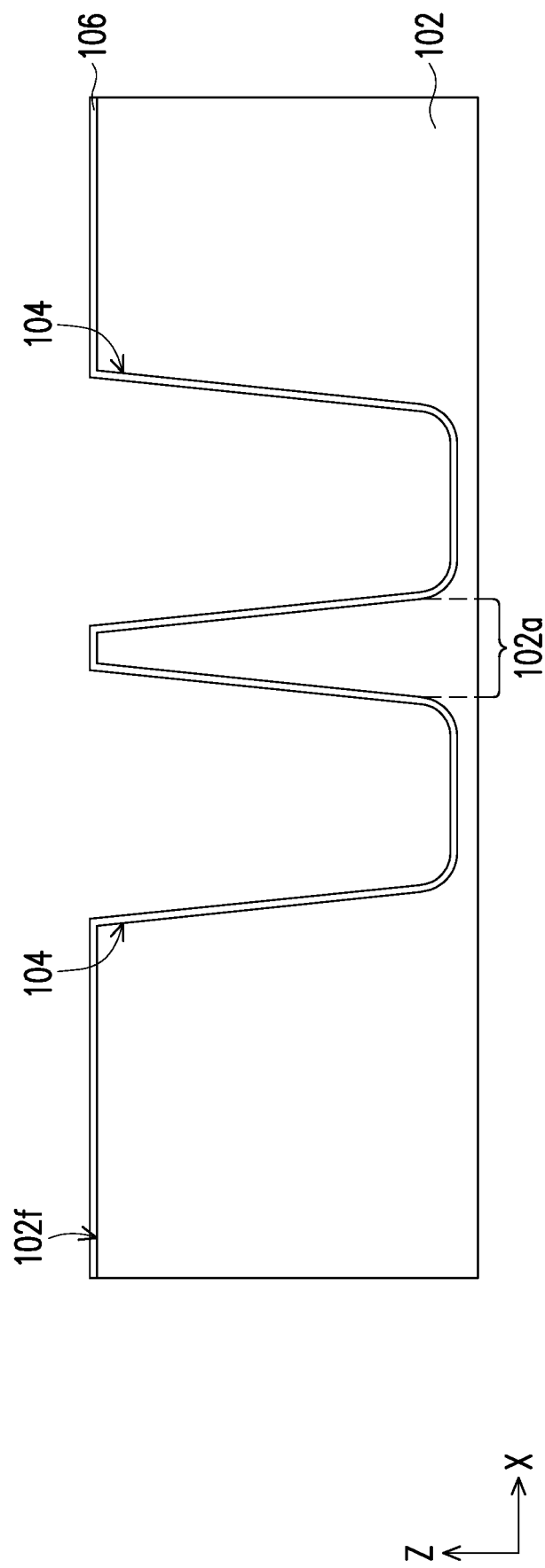

Referring to FIG. 1B, a dielectric liner layer 106 is deposited over the semiconductor substrate 102 covering the semiconductor substrate 102 and further lining and partially filling the trenches 104. The dielectric liner layer 106 extends along the front-side surface 102f of the semiconductor substrate 102 and along sidewalk of the semiconductor substrate 102 that define the trenches 104 and substrate segment 102a. In some embodiments, a material of the dielectric liner layer 106 is or comprises silicon oxide, a high k dielectric (such as silicon nitride, hafnium oxide, zirconium oxide, lanthanum oxide, titanium oxide, aluminum oxide, yttrium oxide, or tantalum oxide), or any combination of the foregoing. The dielectric liner layer 106 may, for example, be formed by chemical vapor deposition (CVD), thermal oxidation, any suitable deposition process(es), or any combination of the foregoing.

Figure 1C:
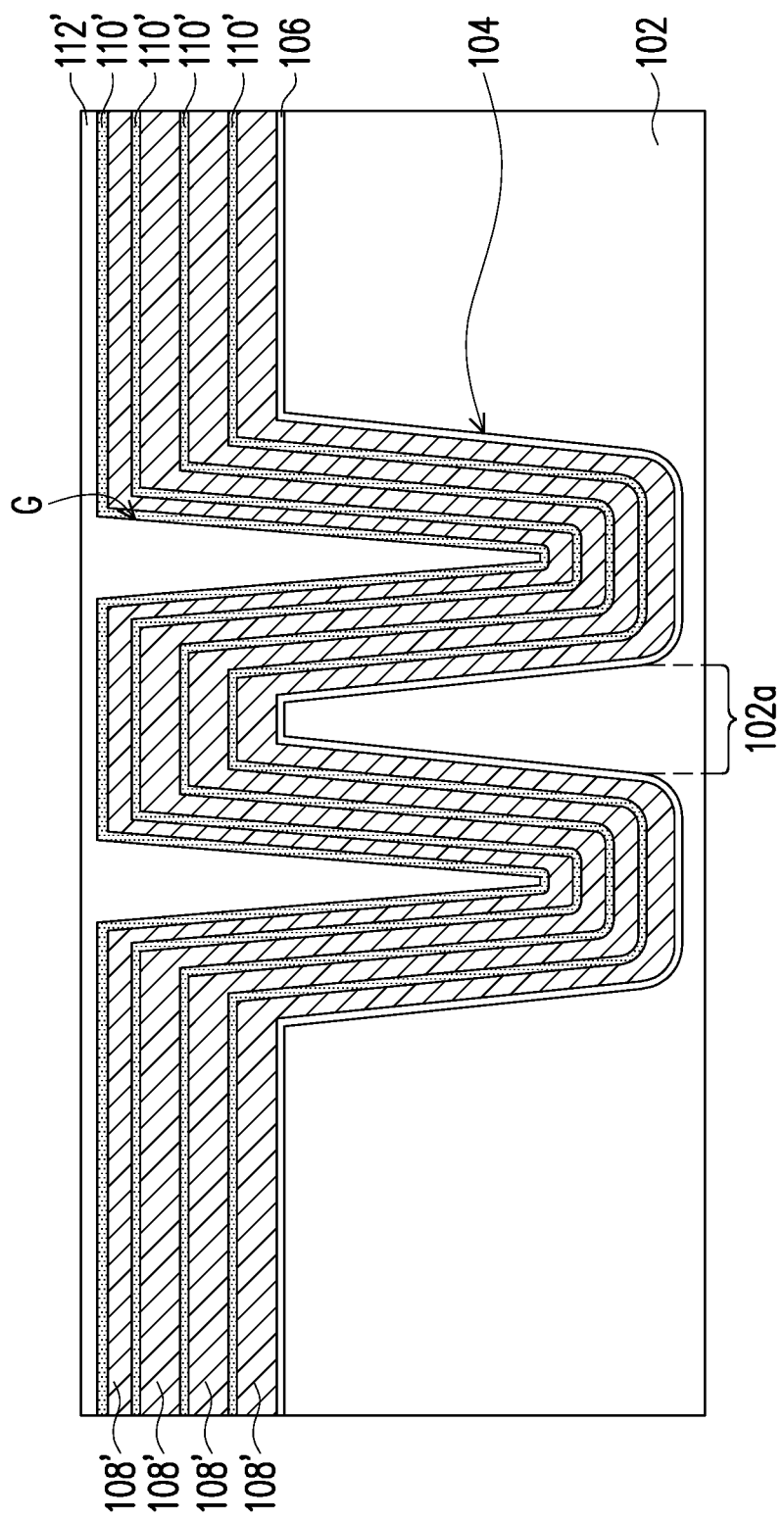

Referring to FIG. 1C, in some embodiments, a plurality of electrode material layers 108' and a plurality of dielectric material layers 110' are deposited in alternation. In some embodiments, the electrode material layers 108' and the dielectric material layers 110' are sequentially deposited and stacked over the dielectric liner layer 106 in alternation. Further, the electrode material layers 108' and the dielectric material layers 110' are deposited conformal to the profile of the trenches 104 and partially filling the trenches 104. In some embodiments, there are gaps G present in the middles of the trenches 104, since the electrode material layers 108' and the dielectric material layers 110' only partially fill the trenches 104. The gaps G correspond to unfilled portions of the trenches 104 and may, for example, also be known as air gaps, voids, cavities, or some other suitable name(s). The electrode material layers 108' and the dielectric material layers 110' may, for example, be formed by CVD, atomic layer deposition (ALD) and/or some other suitable deposition process(es). In some embodiments, materials of the dielectric material layers 110' include silicon oxide, a high k dielectric material, or any combination of the foregoing. For example, the high k dielectric material may be or comprise, for example, hafnium oxide (HfO), aluminum oxide (AlO), tantalum oxide (TaO), doped hafnium oxide, or any combination of the foregoing. In some embodiments, the electrode material layers 108' are or comprise titanium nitride, tantalum nitride, some other suitable conductive material(s) and/or metal(s), or any combination of the foregoing.

With continuing reference to FIG. 1C, a cap layer 112' is deposited. The cap layer 112' is deposited over the semiconductor substrate 102 to cover the dielectric material layers 110' and the electrode material layers 108' and fill the gaps G. In some embodiments, the cap layer 112' fills up the gaps G. In some embodiments, a material of the cap layer 112' may, for example, be or comprise an oxide, such as silicon dioxide, silicon oxynitride, silicon oxycarbide, or another suitable dielectric material. In some embodiments, the cap layer 112' may, for example, be formed by atomic layer deposition (ALD), or another suitable deposition or growth process.

Figure 1D:
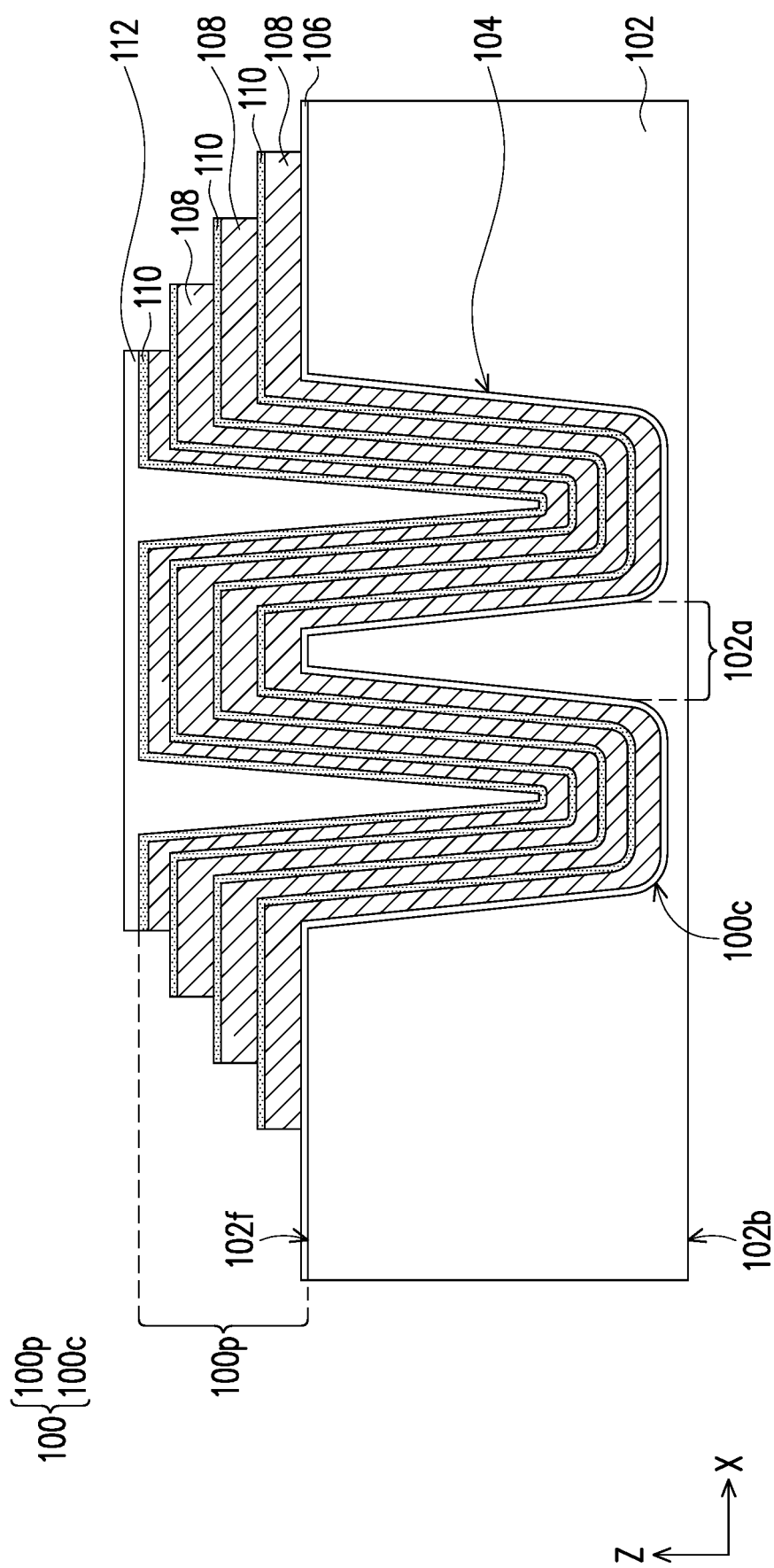

Referring to FIG. 1D, the cap layer 112', the dielectric material layers 110', and the electrode material layers 108' are sequentially patterned. The patterning processes are similar to the previously described patterning process and may be individually modified according to the layout requirement. After the patterning process, a plurality of electrode layers 108, a plurality of electrode dielectric layers 110 and a cap structure 112 are formed. In some embodiments, the alternatingly stacked electrode layers 108 and the electrode dielectric layers 110 form a trench capacitor 100.

In some embodiments, the trench capacitor 100 includes capacitor segments 100c that are disposed inside the trenches 104 in the semiconductor substrate 102 and below the front-side surface 102f, and a protruding portion 100p that is protruded from the front-side surface 102f of the semiconductor substrate 102 and connected with the capacitor segments 100c. In some embodiments, the portions of the electrode layers 108 and the electrode dielectric layers 110 deposited within the trenches 104 of the semiconductor substrate 102 are regarded as the capacitor segments 100c of trench capacitor 100. In some embodiments, the capacitor segments 100c are surrounded by and separated by the semiconductor substrate 102, and each capacitor segment 100c has an outer profile conformal to the profile of the corresponding trench 104. Similar to the trenches 104, the capacitor segments 100c are laterally spaced apart and separated by the substrate segment 102a along the X-direction. In some embodiments in which the trenches 104 do not penetrate the semiconductor substrate 102, the capacitor segments 100c extend downwardly from the front-side surface 102f of the semiconductor substrate 102 into the semiconductor substrate 102 without penetrating through the semiconductor substrate 102. In some embodiments, the capacitor segments 100c may extend downwardly from the front-side surface 102f of the semiconductor substrate 102 to a back-side surface 102b of the semiconductor substrate 102 or penetrate through the semiconductor substrate 102 if a backside thinning process is later optionally performed.

In some embodiments, referring to FIG. 1D and FIG. 2, the protruding portion 100p (the portion of the electrode layers 108 and the electrode dielectric layers 110 disposed above the front-side surface 102f of the semiconductor substrate 102) has a larger spreading span (e.g. larger spreading dimension in the X-direction and Y-direction) than the below capacitor segments 100c. In other words, the protruding portion 100p fully covers the capacitor segments 100c and spreads over and beyond the capacitor segments 100c along the front-side surface 102f of the semiconductor substrate 102 in the X-direction and Y-direction. In alternative embodiments, the protruding portion 100p is protruded from the capacitor segments 100c in the Z-direction and does not spread beyond the capacitor segments 100c. In other words, the boundaries of the protruding portion 100p may aligned with the outermost boundaries of a group of trenches in a unit cell.

Figure 1E:
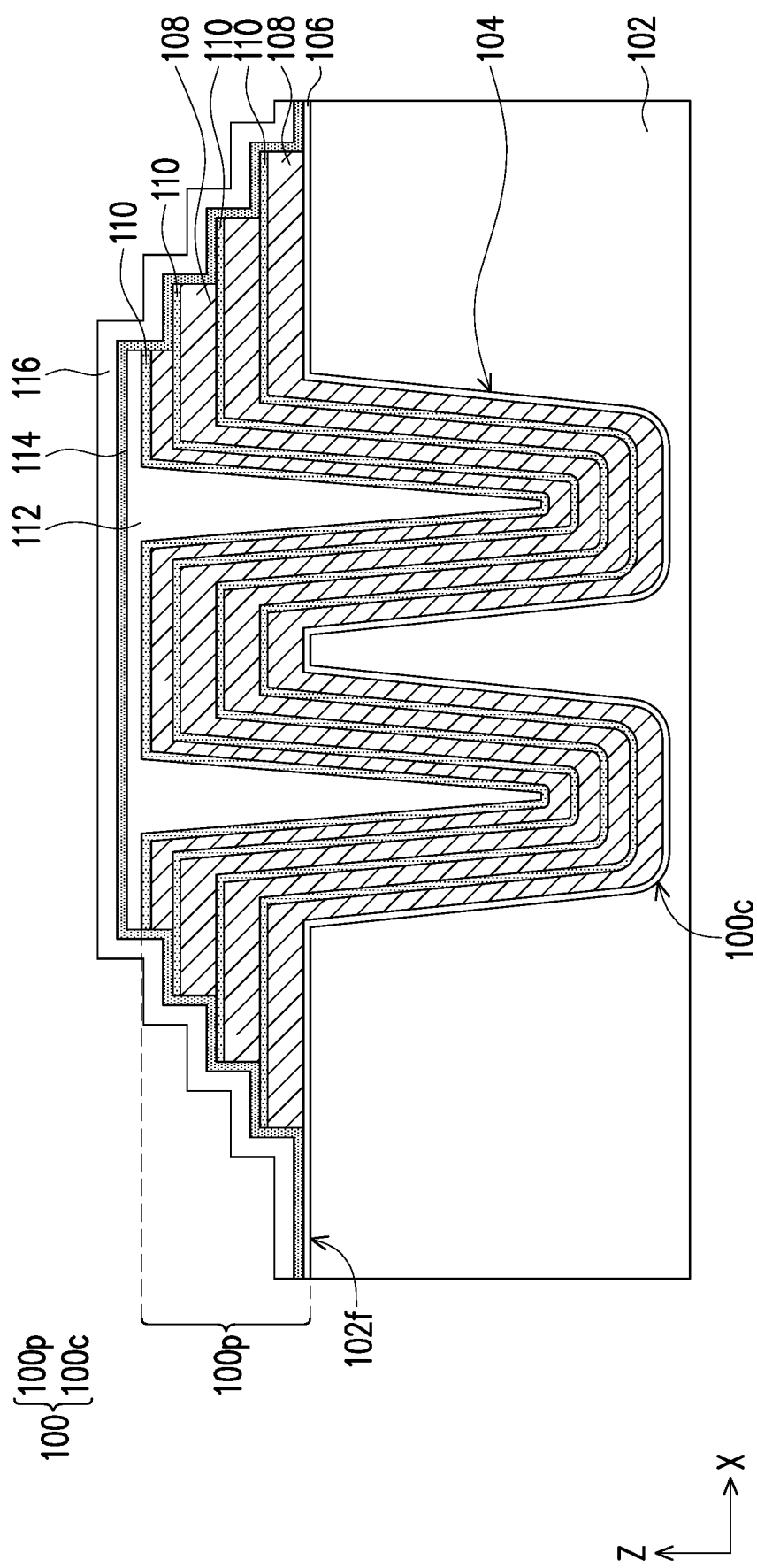

Referring to FIG. 1E, etching stop layers 114 and 116 are globally formed over the semiconductor substrate 102 sequentially covering the protruding portion 110p and the liner layer 106 on the frond-side surface 102f. In alternative embodiments, less or more etching stop layers are deposited. The etching stop layer 114 and/or the etching stop layer 116 may, for example, respectively be or comprise silicon oxide, silicon nitride, any suitable dielectric(s) with etching selectivity, or any combination of the foregoing.

Figure 1F:
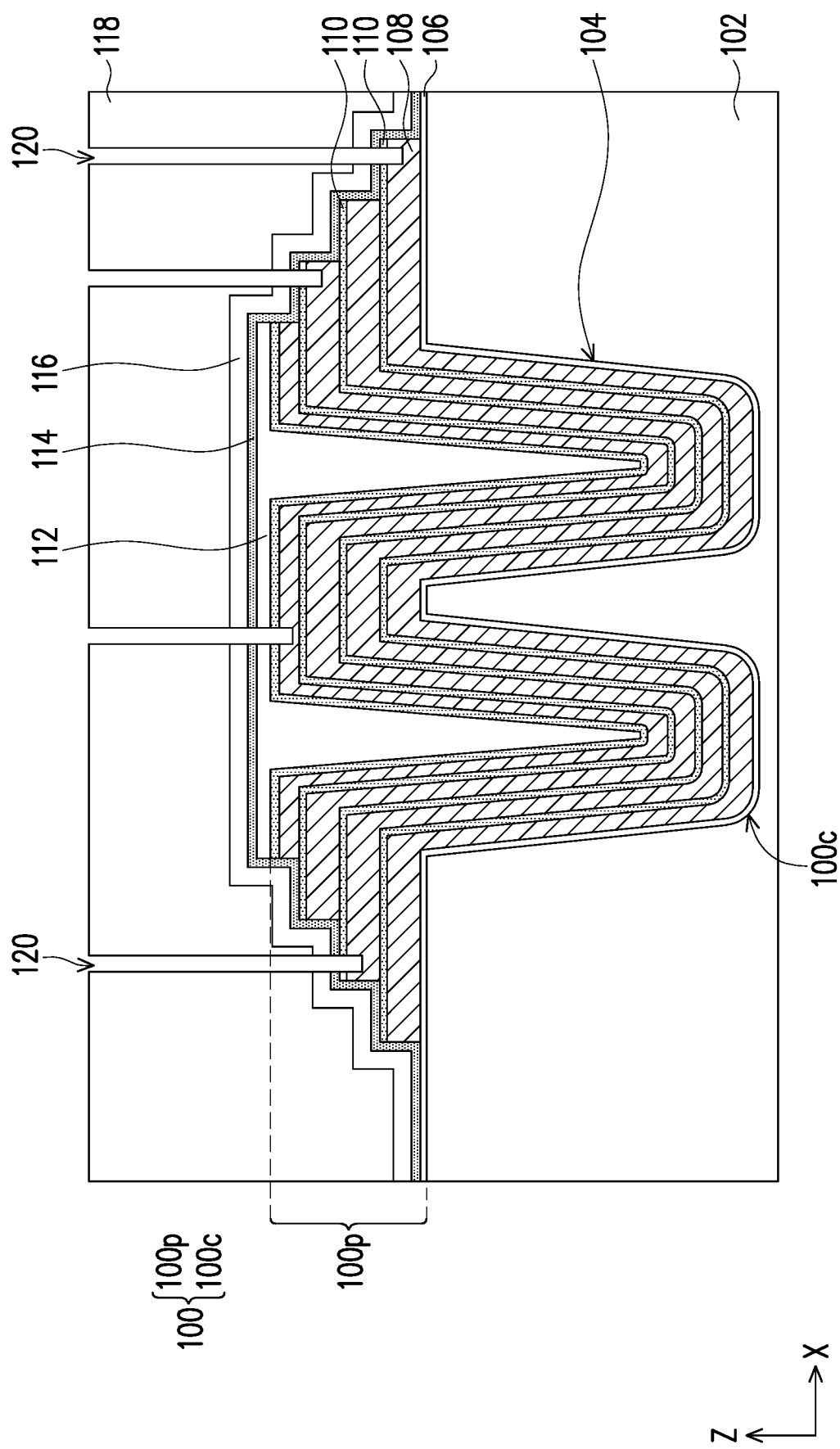

Referring to FIG. 1F, an insulation layer 118 is deposited over the semiconductor substrate 102 covering the etching stop layer 116. In some embodiments, the etching stop layer 114, the etching stop layer 116, and the insulation layer 118 may, for example, respectively be formed by CVD, physical vapor deposition (PVD), thermal oxidation, coating process or another suitable deposition or growth process. In some embodiments, a material of the insulation layer 118 may, for example, be or comprise silicon oxide, or a low-k dielectric layer, and the insulation layer 118 may include multiple layers of insulation materials. In FIG. 1F, a plurality of contact openings 120 is formed penetrating through the etching stop layer 114, the etching stop layer 116, and the insulation layer 118 with different depths to expose the upper surface(s) of the respective electrode layer(s) 108.

Figure 1G:
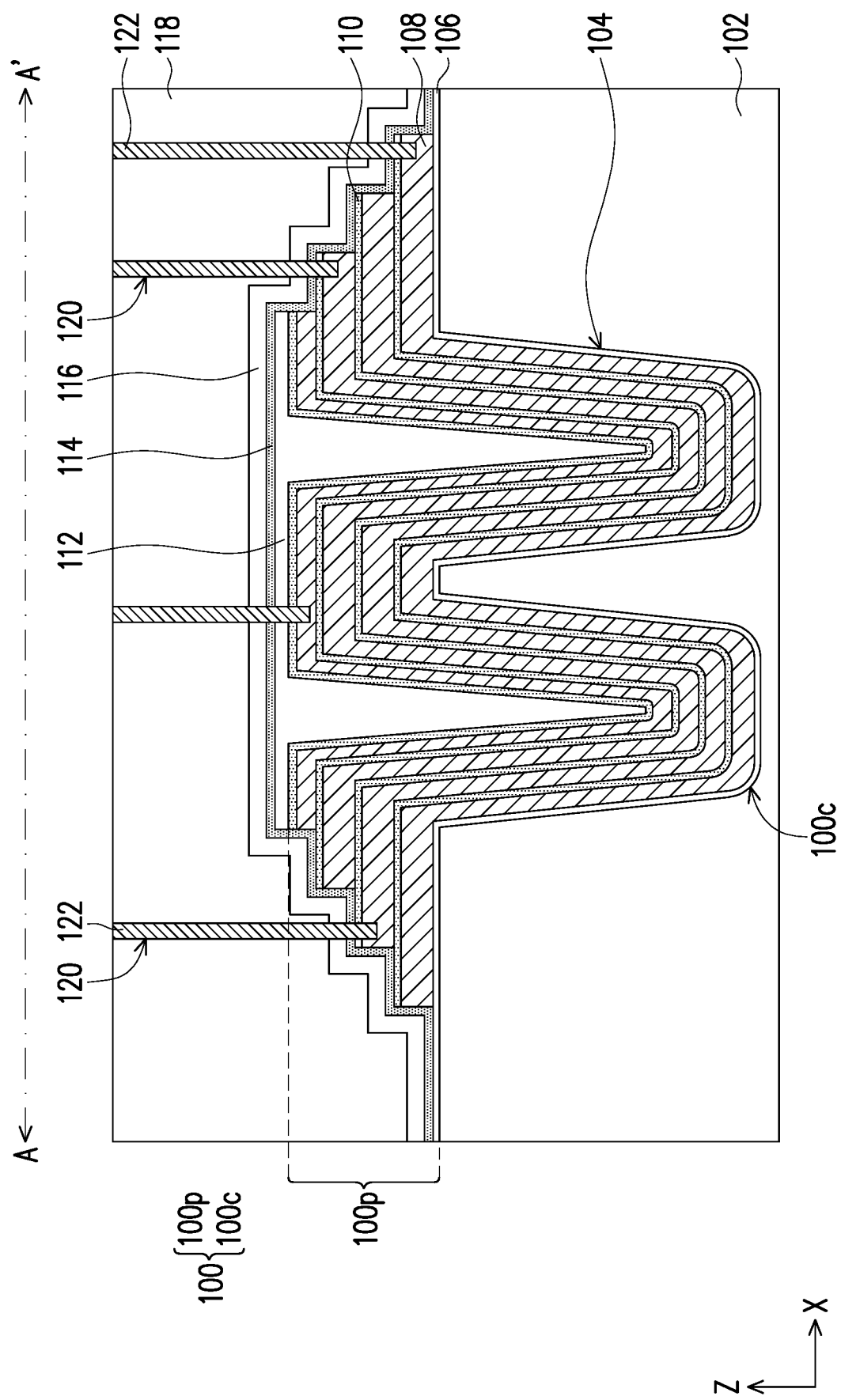

Referring to FIG. 1G, conductive vias 122 are formed inside the via openings 120 over the electrode layers 108 respectively. As seen in FIG. 1G and FIG. 2, the conductive vias 122 extend from the connected electrode layers 108 to above metallization pattern or metal lines (not shown). In some embodiments, the formation of the conductive vias 122 may involve depositing a conductive material (e.g., copper, aluminum, tungsten, titanium nitride, tantalum nitride, etc.) over the semiconductor substrate 102 by CVD, PVD, sputtering, electroplating, electroless plating, etc. to fill up the contact openings 120 and performing a planarization process (e.g., a chemical mechanical planarization (CMP) process) to remove the extra conductive material until an upper surface of the insulation layer 118 is exposed.

Referring to FIG. 2, a perspective view of a unit cell 200 is shown. The schematic view of FIG. 1G may be directed to a portion of the unit cell 200 along the line A-A'. In some embodiments, the capacitor segments 100c (in dotted lines) located in the trenches 104, the protruding portion 100p covering the capacitor segments 100c, the insulating layer 118 and the conductive vias 122 (in dotted lines) connected to the electrode layer(s) 108 of the protruding portion 100p are shown in the drawings, and the protruding portion 100p and the insulating layer 118 are depicted as being transparent to show the configurations of capacitor segments 100c in the unit cell 200.

With continuing reference to FIG. 1G and further reference to FIG. 2, one unit cell 200 corresponds to the region where the trenches 104 are arranged in the integrated chip. In other words, the capacitor segments 100c (or trenches 104) are arranged as an array in the unit cell 200 (i.e., a trench array). That is, the outermost edge profile of the trench array determines the shape(s) of the unit cell. The number of the capacitor segments 100c arranged in the unit cell 200 is, for example, five or more, but it is not limited by the drawings. In some embodiments, the capacitor segments 100c are spaced apart from one another and arranged in parallel along an arrangement direction (e.g., the X-direction), and each of the capacitor segments 100c has a strip shape extending in an extension direction (e.g., the Y-direction). In some embodiments, the arrangement direction is intersected with the extension direction, and an angle between the arrangement direction and the extension direction is an oblique angle. In some embodiments, the arrangement direction is at a right angle to the extension direction. In the present disclosure, the oblique angle refers to an angle smaller than or greater than 90 degrees.

In some embodiments, as seen in FIG. 2, the unit cell 200 may have a top view of a polygon shape such as tetragon, pentagon, hexagon, octagon, trapezoid, or rhombus. In some embodiments, a top-view profile of the unit cell 200 is hexagon as shown in FIG. 2. In alternative embodiments, the top-view profile of the unit cell 200 is as in any of FIGS. 4, 5, 7, 9, and 14, as will be described later.

FIGS. 3A-3C, 4, 5, 6A-6B, 7, 8A-8B, 9, and 10A-10B illustrate layout arrangements of capacitor segments of a trench capacitor in accordance with some embodiments. For clarity of illustrations, the protruding portion(s) of the trench capacitor(s) are omitted in the drawings. It is to be noted that in the drawings a trench capacitor is drawn with a dashed line and regarded as a unit cell. In alternative embodiments, the single trench capacitor may also correspond to any number of unit cells.

Referring to FIG. 3A, a first unit cell 300A and a second unit cell 310A are provided. In the first unit cell 300A, first capacitor segments 302A include separate segments of different extending lengths arranged in parallel. Each of the first capacitor segments 302A extends along a first extension direction ED1. The first capacitor segments 302A are spaced apart and arranged parallel to each other in a first arrangement direction AD1. In some embodiments, the first arrangement direction AD1 is perpendicular to the first extension direction ED1. As the outermost edge profile of the trench array determines the shape of the unit cell, the hexagonal shape of the first unit cell 300A may be established by drawing lines connecting the end points of the first capacitor segments 302A (as the dashed line LC1) and extending lines LE1 along the outermost sides of the two first outer segments 306A.

In the second unit cell 310A, second capacitor segments 312A include separate segments of different extending lengths arranged in parallel. Each of the second capacitor segments 312A extends along a second extension direction ED2. The second capacitor segments 312A are spaced apart and arranged parallel to each other in a second arrangement direction AD2. In some embodiments, the second arrangement direction AD2 is perpendicular to the second extension direction ED2. As the outermost edge profile of the trench array determines the shape of the unit cell, the hexagonal shape of the second unit cell 310A may be established by drawing lines connecting the end points of the second capacitor segments 312A (as the dashed line LC2) and extending lines LE2 along the outermost sides of the two second outer segments 316A.

As seen in FIG. 3A, the arrangement directions AD1 and AD2 are obliquely intersected and an angle θa between the first arrangement direction AD1 and the second arrangement direction AD2 is an acute angle. In some embodiments, the first extension direction ED1 and the second extension direction ED2 are obliquely intersected with an angle θt, which is an acute angle. In some embodiments, the second unit cell 310A is adjacent to the first unit cell 300A. In further embodiments, the unit cells 300A and 310A are located on the semiconductor substrate 102 in the manner of side-by-side. As the arrangement directions of the trenches are different or the extending directions of the trenches are different, stresses propagates along different directions and is distributed more uniformly in the semiconductor substrate 102, thereby improving the quality of the trench capacitors.

One of the capacitor segments 302A and 312A has an extending length different from that of another of the capacitor segments 302A and 312A. In some embodiments, the first capacitor segments 302A include a first middle segment 304A at the middle of the first unit cell 300A. The second capacitor segments 312A include a second middle segment 314A at the middle of the second unit cell 310A. The middle segments 304A and 314A respectively have the longest extending length. In one embodiment, the outer segments 306A and 316A respectively have the shortest extending length. In other words, the extending length of the first middle segment 304A is greater than that of the first outer segment 306A, and the extending length of the second middle segment 314A is greater than that of the second outer segment 316A. In further embodiments, the extending lengths of the first capacitor segments 302A are gradually decreased from the first middle segment 304A to one or two of the first outer segments 306A. The extending lengths of the second capacitor segments 312A are gradually decreased from the second middle segment 314A to one or two of the second outer segments 316A.

In some embodiments, at least two of the first capacitor segments 302A and the second capacitor segments 312A have substantially the same extending lengths respectively. In further embodiments, the two first outer segments 306A and/or the two second outer segments 316A have substantially the same extending lengths. The unit cells 300A and 310A each respectively has a pattern symmetric to the first middle segment 304A or the second middle segment 314A (as a symmetry axis).

Referring to FIG. 3B, FIG. 3B illustrates layouts of some embodiments of a first unit cell 300B and a second unit cell 310B according to some alternative embodiments of the unit cells 300A and 310A of FIG. 3A.

In the first unit cell 300B, first capacitor segments 302B include at least two first middle segments 304B at the middle of the first unit cell 300B. In some embodiments, the first middle segments 304B are lined as a straight line in the manner of head-to-head in the first extension direction ED1. In some embodiments, the first middle segments 304B have substantially the same extending length. In one embodiment, the first middle segment 304B has the shortest extending length. In other words, the extending length of the first middle segments 304B is less than the extending length of the first outer segments 306B.

In the second unit cell 310B, second capacitor segments 312B include at least two second middle segments 314B at the middle of the second unit cell 310B. In some embodiments, the second middle segments 314B are lined as a straight line in the manner of head-to-head in the second extension direction ED2. In some embodiments, the second middle segments 314B have substantially the same extending length. In one embodiment, the second middle segment 314B has the shortest extending length. In other words, the extending length of the second middle segments 314B is less than the extending length of the second outer segments 316B.

Figure 3C:
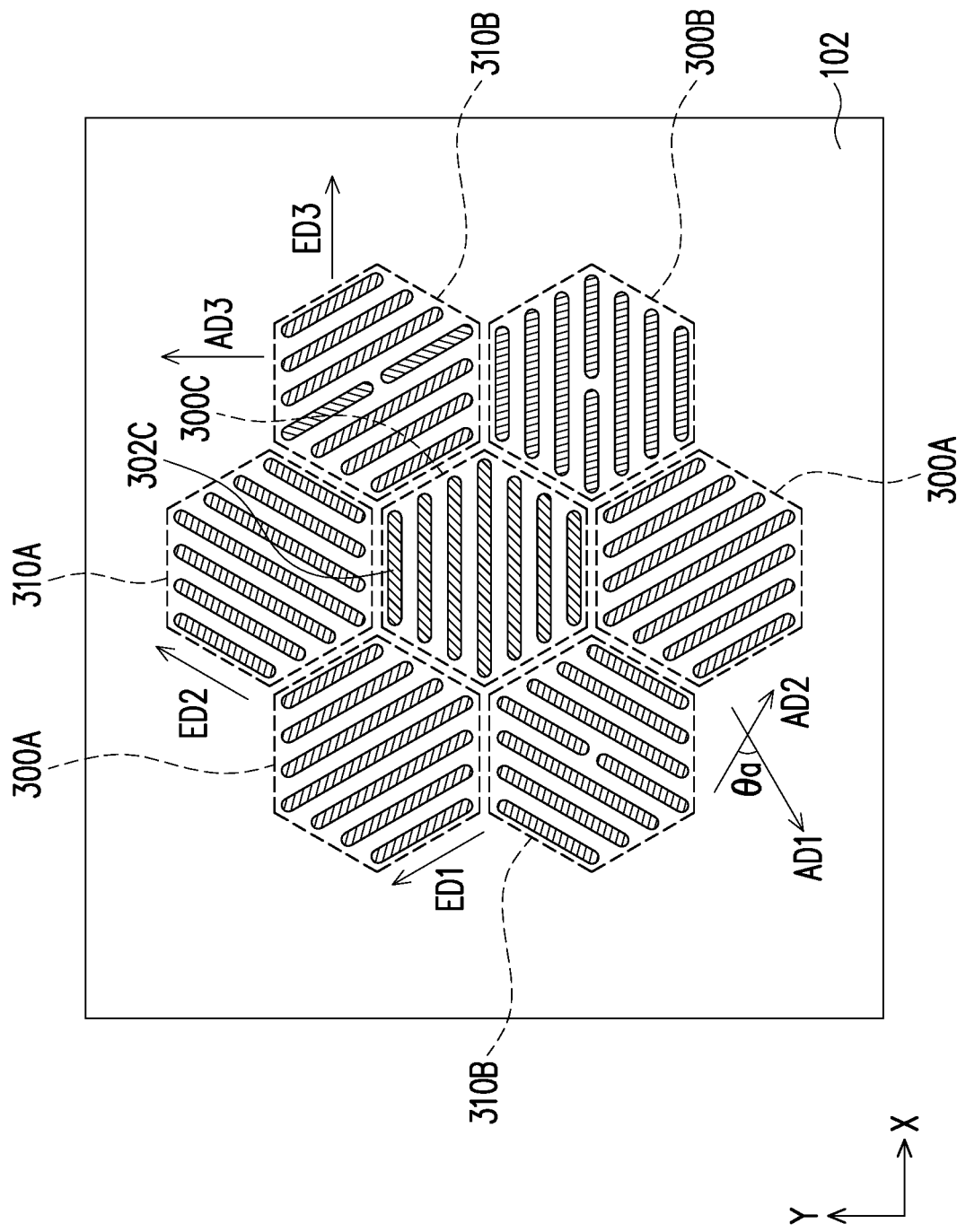

Referring to FIG. 3C, FIG. 3C illustrates layouts of some embodiments of the first unit cell 300A, the first unit cell 300B, the second unit cell 310A, the second unit cell 310B, and a center unit cell 300C.

The center unit cell 300C is adjacent to the first unit cell 300A, the first t cell 300B, the second unit cell 310A, and the second unit cell 310B in the manner of side-by-side. In the center unit cell 300C, center capacitor segments 302C include separate segments of different extending lengths arranged in parallel. The center capacitor segments 302C are spaced apart and arranged parallel to each other in a center arrangement direction AD3 and each of them extends along a center extension direction ED3. In some embodiments, the center unit cell 300C uses one exemplary pattern of the first unit cell 300A of FIG. 3A. In alternative embodiments, the center unit cell 300C uses one exemplary pattern of the first unit cell 300B of FIG. 3B. Further, the first arrangement direction AD1, the second arrangement direction AD2, and the center arrangement direction AD3 are obliquely intersected. In alternative embodiments, unit cells which is selected from the group of the first unit cell 300A, the first unit cell 300B, the second unit cell 310A, the second unit cell 310B, and another suitable unit cell are arranged adjacent one another in the manner of side-by-side.

Figure 4:
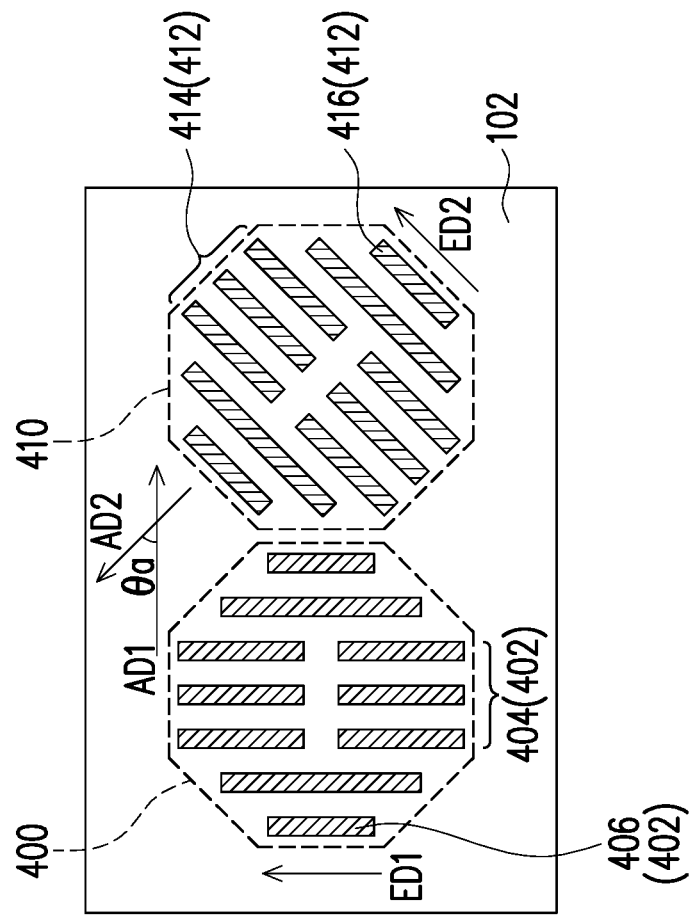

Referring to FIG. 4, FIG. 4 illustrates layouts of some embodiments of a first unit cell 400 and a second unit cell 410. In some embodiments, the first unit cell 400 and the second unit cell 410 have an octagonal shape.

In the first unit cell 400, first capacitor segments 402 include a plurality of first middle segments 404 (six first middle segments are shown) at the middle of the first unit cell 400. In some embodiments, the first middle segments 404 have substantially the same extending length. In some embodiments, first outer segments 406 of the outermost sides of first unit cell 400 have the shortest extending length. In other words, the extending length of the first middle segments 404 is greater than the extending length of a first outer segment 406.

In the second unit cell 410, second capacitor segments 412 include a plurality of second middle segments 414 (six second middle segments are shown) at the middle of the second unit cell 410. In some embodiments, the second middle segments 414 have substantially the same extending length. In some embodiments, second outer segments 416 of the outermost sides of second unit cell 410 have the shortest extending length. In other words, the extending length of the second middle segments 414 is greater than the extending length of a second outer segment 416.

Figure 5:
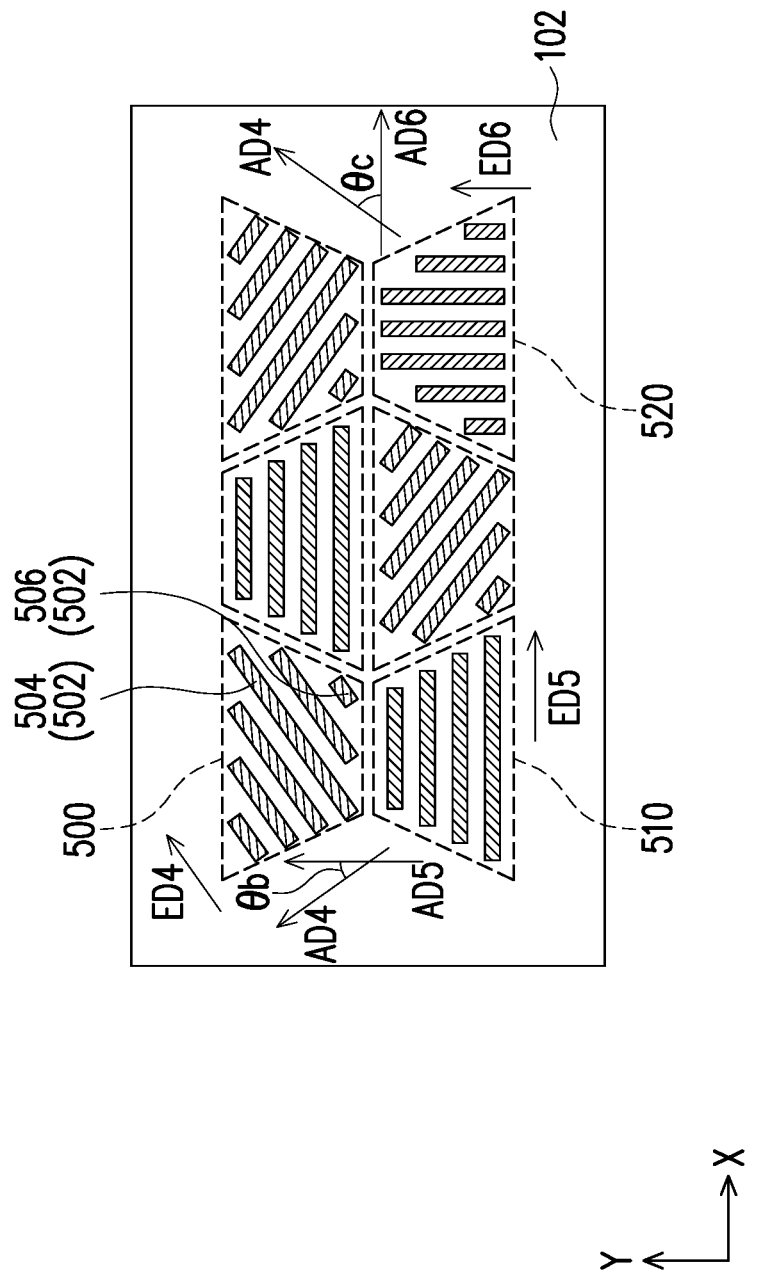
Figure 6B:
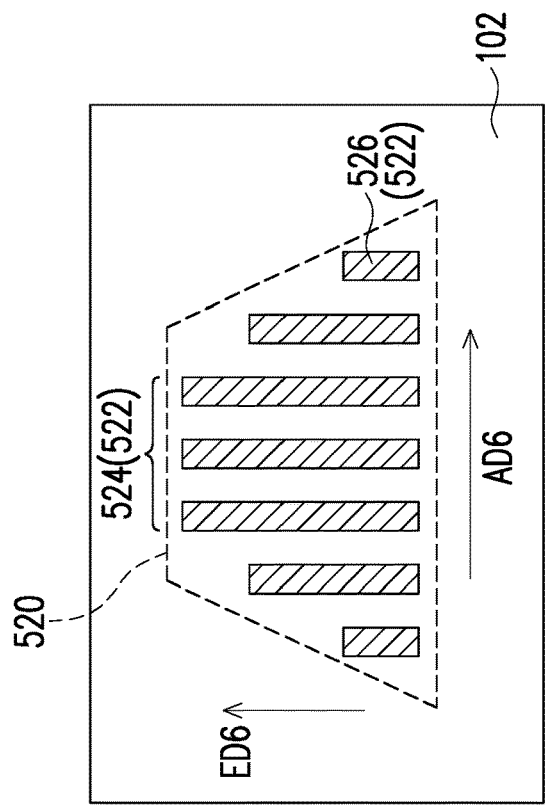
Figure 6A:
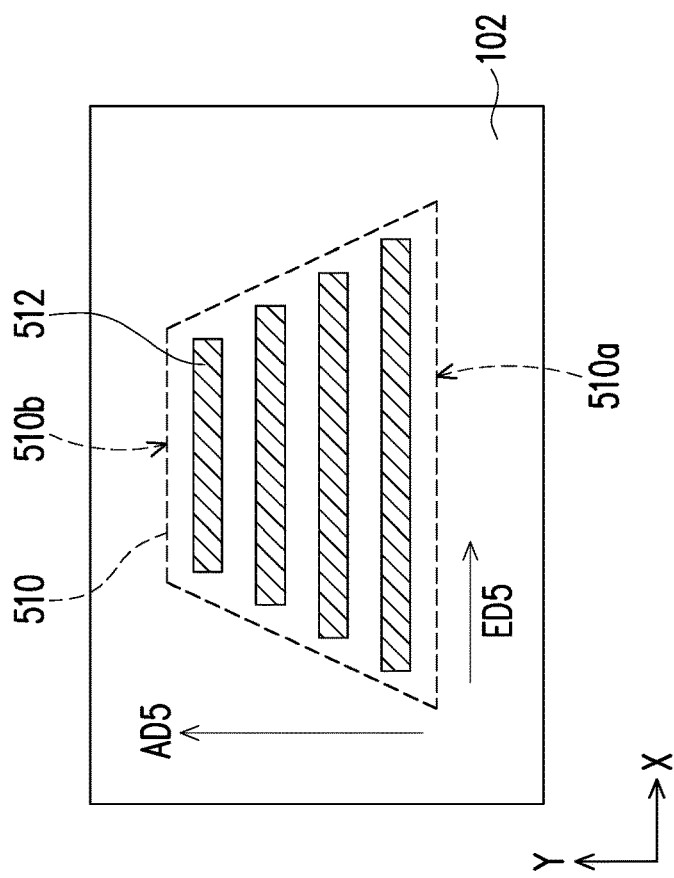

Referring to FIGS. 5, 6A, and 6B, FIG. 5 illustrates layouts of some embodiments of a first unit cell 500, a second unit cell 510, a third unit cell 520 according to some alternative embodiments of the unit cells 300A and 310A of FIG. 3A. FIG. 6A illustrates layouts of the second unit cell 510 of FIG. 5. FIG. 6B illustrates layouts of the third unit cell 520 of FIG. 5. In some embodiments, the first unit cell 500, the second unit cell 510, and the third unit cell 520 have a trapezoid shape.

In the first unit cell 500, first capacitor segments 502 include separate segments of different extending lengths arranged in parallel. Each of the first capacitor segments 502 extends along a first extension direction ED4. The first capacitor segments 502 are spaced apart and arranged parallel to each other in a first arrangement direction AD4. The first arrangement direction AD4 and the first extension direction ED4 are obliquely intersected. In some embodiments, the first extension direction ED4 is, for example, parallel to a diagonal of the trapezoid shape of the first unit cell 500.

In the second unit cell 510, second capacitor segments 512 include separate segments of different extending lengths arranged in parallel. Each of the second capacitor segments 512 extends along a second extension direction ED5. The second capacitor segments 512 are spaced apart and parallel to each other in a second arrangement direction AD5. In some embodiments, the second arrangement direction AD5 is perpendicular to the second extension direction ED5.

In the third unit cell 520, third capacitor segments 522 are include separate segments of different extending lengths arranged in parallel. Each of the third capacitor segments 522 extends along a third extension direction ED6. The third capacitor segments 522 are spaced apart and parallel to each other in a third arrangement direction AD6. In some embodiments, the third arrangement direction AD6 is perpendicular to the third extension direction ED6.

As seen in FIG. 5, the arrangement directions AD4 and AD5 are obliquely intersected and an angle θb between the first arrangement direction AD4 and the second arrangement direction AD5 is an acute angle. In some embodiments, the first extension direction ED4 and the second extension direction ED5 are obliquely intersected. In some embodiments, the arrangement directions AD4 and AD6 are obliquely intersected and an angle θc between the first arrangement direction AD4 and the third arrangement direction AD6 is an acute angle. In some embodiments, the first extension direction ED4 and the third extension direction ED6 are obliquely intersected. In some embodiments, the first unit cell 500 is adjacent to the second unit cell 510 and the third unit cell 520. In further embodiments, the first unit cell 500, the second unit cell 510 and the third unit cell 520 are located on the semiconductor substrate 102 in the manner of side-by-side.

In some embodiments, one of the first capacitor segments 502 has an extending length different from that of another of the first capacitor segments 502. The first capacitor segments 502 include a first middle segment 504 at the middle of the first unit cell 500 and two first outer segments 506 at the outermost sides of the first unit cell 500. In some embodiments, the first middle segment 504 has the longest extending length. In other words, the extending length of the first middle segment 504 is greater than that of the first outer segments 506. In one embodiment, one of the first outer segments 506 has the extending length less than that of the other first outer segment 506. In further embodiments, the extending lengths of the first capacitor segments 502 are gradually decreased from the first middle segment 504 to one or two of the first outer segments 506.

As seen in FIGS. 5 and 6A, one of the second capacitor segments 512 has an extending length different from that of another of second capacitor segments 512. In some embodiments, one outermost second capacitor segment 512 has an extending length less than that of another outermost second capacitor segment 512. In one embodiment, the extending lengths of the second capacitor segments 512 are gradually decreased from one edge 510a to opposite edge 510b of the second unit cell 510 in the second arrangement direction AD5.

As seen in FIGS. 5 and 6B, the third capacitor segments 522 include a plurality of third middle segments 524 (three third middle segments are shown) at the middle of the third unit cell 520 and two third outer segments 526 at the outermost sides of the third unit cell 520. In some embodiments, the third middle segments 524 have substantially the same extending length and the longest extending length of the third capacitor segments 522. In some embodiments, the third outer segments 526 have substantially the same extending length and the shortest extending length of the third capacitor segments 522. In other words, the extending length of the third middle segments 524 is greater than the extending length of the third outer segments 526. In one embodiment, the extending lengths of the third capacitor segments 522 are gradually decreased from the third middle segments 524 to one or two of the third outer segment 526.

Figure 7:
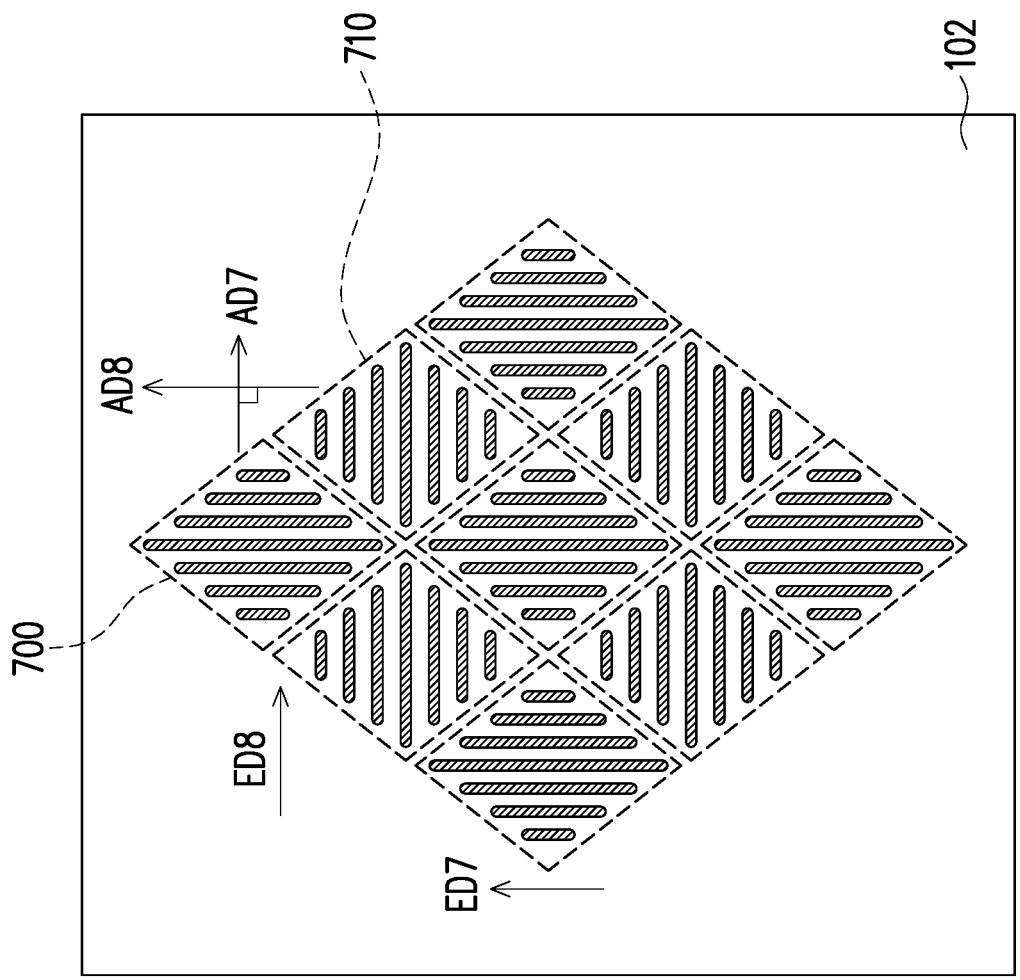
Figure 8B:
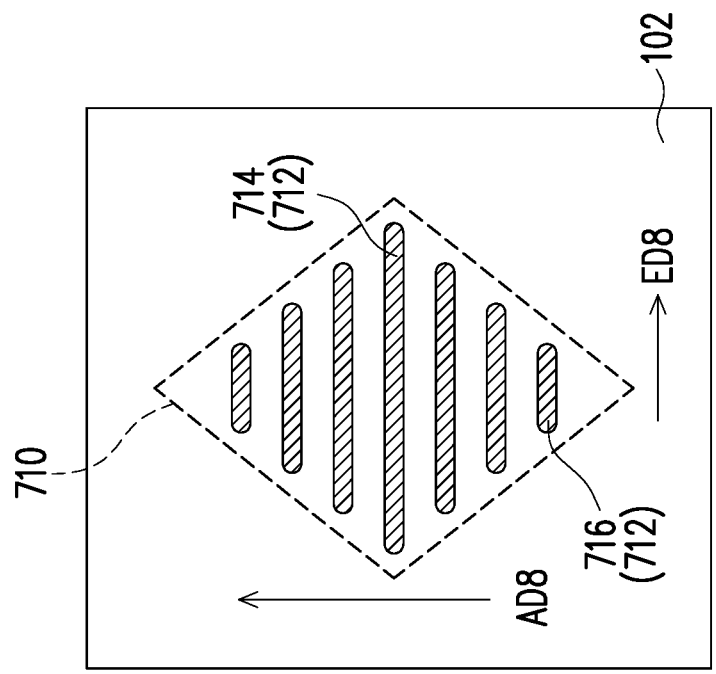
Figure 8A:
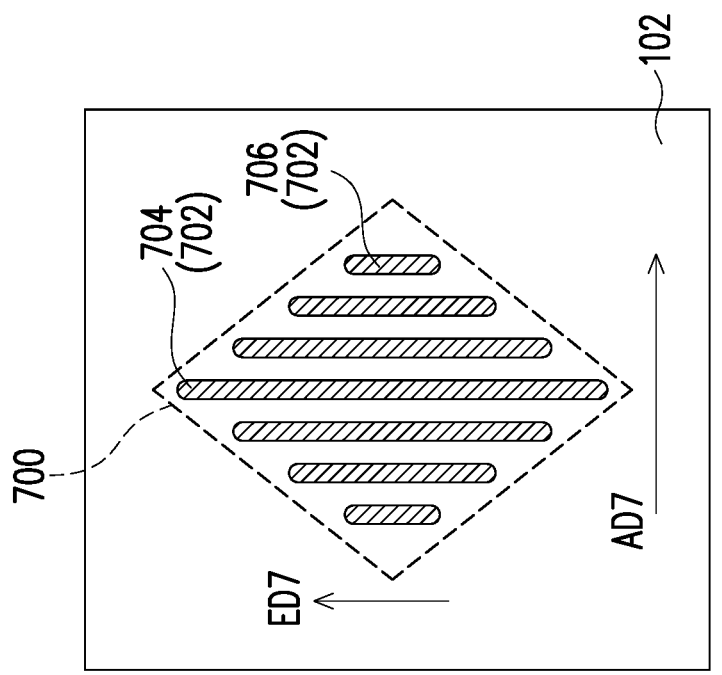

Referring to FIGS. 7, 8A, and 8B, FIG. 7 illustrates layouts of some embodiments of a first unit cell 700 and a second unit cell 710 according to some alternative embodiments of the unit cells 300A and 310A of FIG. 3A. FIG. 8A illustrate layouts of the first unit cell 700 of FIG. 7. FIG. 8B illustrate layouts of the second unit cell 710 of FIG. 7. In some embodiments, the first unit cell 700 and the second unit cell 710 have a rhombus shape.

In the first unit cell 700, first capacitor segments 702 include separate segments of different extending lengths arranged in parallel. Each of the first capacitor segments 702 extends along a first extension direction ED7. The first capacitor segments 702 are spaced apart and arranged parallel to each other in a first arrangement direction AD7. In some embodiments, the first arrangement direction AD7 is perpendicular to the first extension direction ED7. In some embodiments, the first extension direction ED7 is, for example, parallel to a diagonal of the rhombus shape of the first unit cell 700.

In the second unit cell 710, second capacitor segments 712 include separate segments of different extending lengths arranged in parallel. Each of the second capacitor segments 712 extends along a second extension direction ED8. The second capacitor segments 712 are spaced apart and arranged parallel to each other in a second arrangement direction AD8. In some embodiments, the second arrangement direction AD8 is perpendicular to the second extension direction ED8. In some embodiments, the second extension direction ED8 is, for example, parallel to a diagonal of the rhombus shape of the second unit cell 710.

As seen in FIG. 7, an angle between the first arrangement direction AD7 and the second arrangement direction AD8 is a right angle. In other words, the first extension direction ED7 is perpendicular to the second extension direction ED8. In some embodiments, the first unit cell 700 is adjacent to the second unit cell 710. In further embodiments, the first unit cell 700 and the second unit cell 710 are located on the semiconductor substrate 102 in the manner of side-by-side. In some embodiments, the first unit cell 700 and the second unit cell 710 are arranged as an array in alternation. In alternative embodiments, the first unit cell 700 and the second unit cell 710 are arranged side-by-side in a random way.

One of the first capacitor segments 702 has an extending length different from that of another of the first capacitor segments 702. In some embodiments, the first capacitor segments 702 include a first middle segment 704 at the middle of the first unit cell 700 and two first outer segments 706 at the outermost sides of the first unit cell 700. In some embodiments, the first middle segment 704 has the longest extending length. In one embodiment, the first outer segments 706 have substantially the same extending length and the shortest extending length of the first capacitor segments 702. In other words, the extending length of the first middle segment 704 is greater than the extending length of the first outer segments 706. In further embodiments, the extending lengths of the first capacitor segments 702 are gradually decreased from the first middle segment 704 to one or two of the first outer segments 706.

One of the second capacitor segments 712 has an extending length different from that of another of the second capacitor segments 712. In some embodiments, the second capacitor segments 712 include a second middle segment 714 at the middle of the second unit cell 710 and two second outer segments 716 at the outermost sides of the second unit cell 710. Similar to the first unit cell 700, the extending lengths of the second capacitor segments 712 are gradually decreased from the second middle segment 714 to one or two of the second outer segments 716. In some embodiments, the length of the first middle segment 704 is greater than the length of the second middle segment 714.

Figure 9:
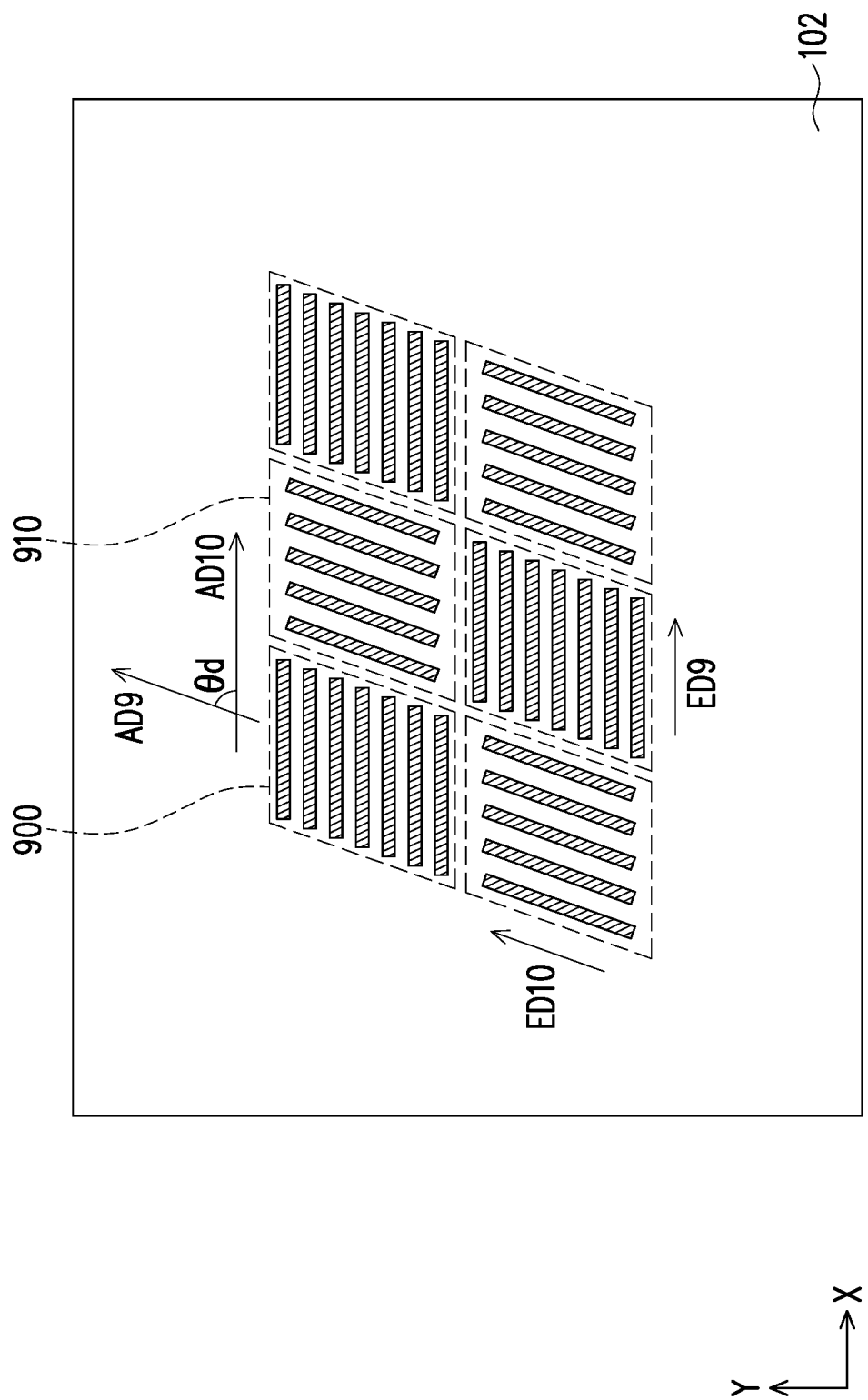
Figure 10B:
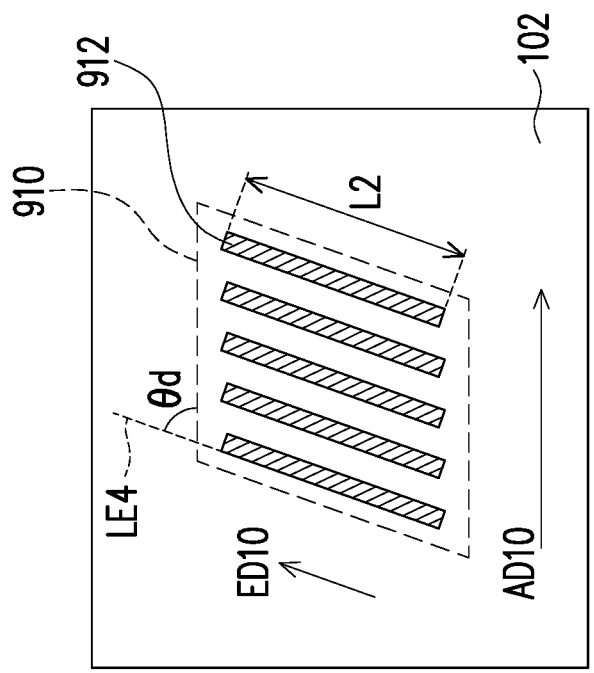
Figure 10A:
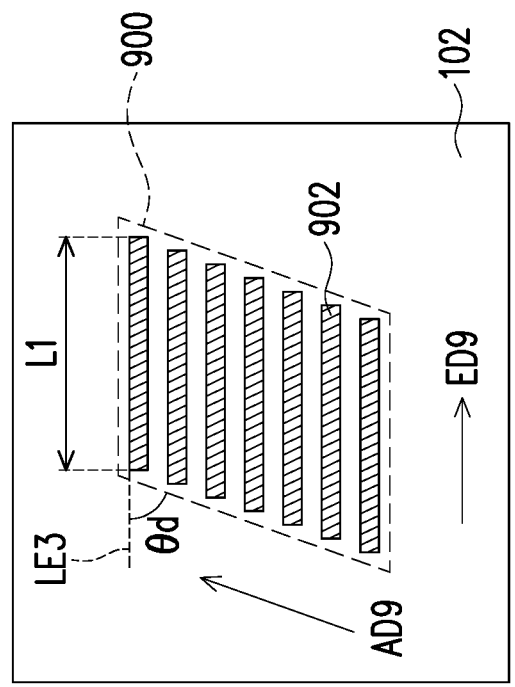

Referring to FIGS. 9, 10A, and 10B, FIG. 9 illustrates layouts of some embodiments of a first unit cell 900 and a second unit cell 910 according to some alternative embodiments of the unit cells 300A and 310A of FIG. 3A. FIG. 8A illustrate layouts of the first unit cell 900 of FIG. 9. FIG. 8B illustrate layouts of the second unit cell 910 of FIG. 9. In some embodiments, the first unit cell 900 and the second unit cell 910 have a parallelogram shape.

In the first unit cell 900, first capacitor segments 902 include separate segments of different extending lengths arranged in parallel. Each of the first capacitor segments 902 extends along a first extension direction ED9. The first capacitor segments 902 are spaced apart and arranged parallel to each other in a first arrangement direction AD9. In some embodiments, the first arrangement direction AD9 and the first extension direction ED9 are obliquely intersected.

In the second unit cell 910, second capacitor segments 912 include separate segments of different extending lengths arranged in parallel. Each of the second capacitor segments 912 extends along a second extension direction ED10. The second capacitor segments 912 are spaced apart and arranged parallel to each other in a second arrangement direction AD10. The second arrangement direction AD10 and the second extension direction ED10 are obliquely intersected.

As seen in FIG. 9, the arrangement directions AD9 and AD10 are obliquely intersected and an angle θd between the first arrangement direction AD9 and the second arrangement direction AD10 is an acute angle. In some embodiments, the first extension direction ED9 and the second extension direction ED10 are obliquely intersected. In some embodiments, the first unit cell 900 is adjacent to the second unit cell 910. In further embodiments, the first unit cell 900 and the second unit cell 910 are located on the semiconductor substrate 102 in the manner of side-by-side. As seen in FIG. 9, the first arrangement direction AD9 is parallel to an edge of first unit cell 900, and the second arrangement direction AD10 is parallel to another edge of first unit cell 900. In such embodiments, as seen in FIG. 10A, an extending line LE3 along the outermost side of the first capacitor segments 902 is intersected with the edge of first unit cell 900 at an angle θd. As seen in FIG. 10B, similar to the first unit cell 900, an extending line LE4 along the outermost side of the second capacitor segments 912 and the edge of second unit cell 910 are intersected at an angle θd.

In some embodiments, the first capacitor segments 902 have substantially the same extending length L1, and the second capacitor segments 912 have substantially the same extending length L2. In further embodiments, the extending length L2 of the second capacitor segments 912 are greater than the extending length L1 of the first capacitor segments 902. In alternative embodiments, the extending length L2 of the second capacitor segments 912 are less than or equal to the extending length L1 of the first capacitor segments 902.

Figure 11:
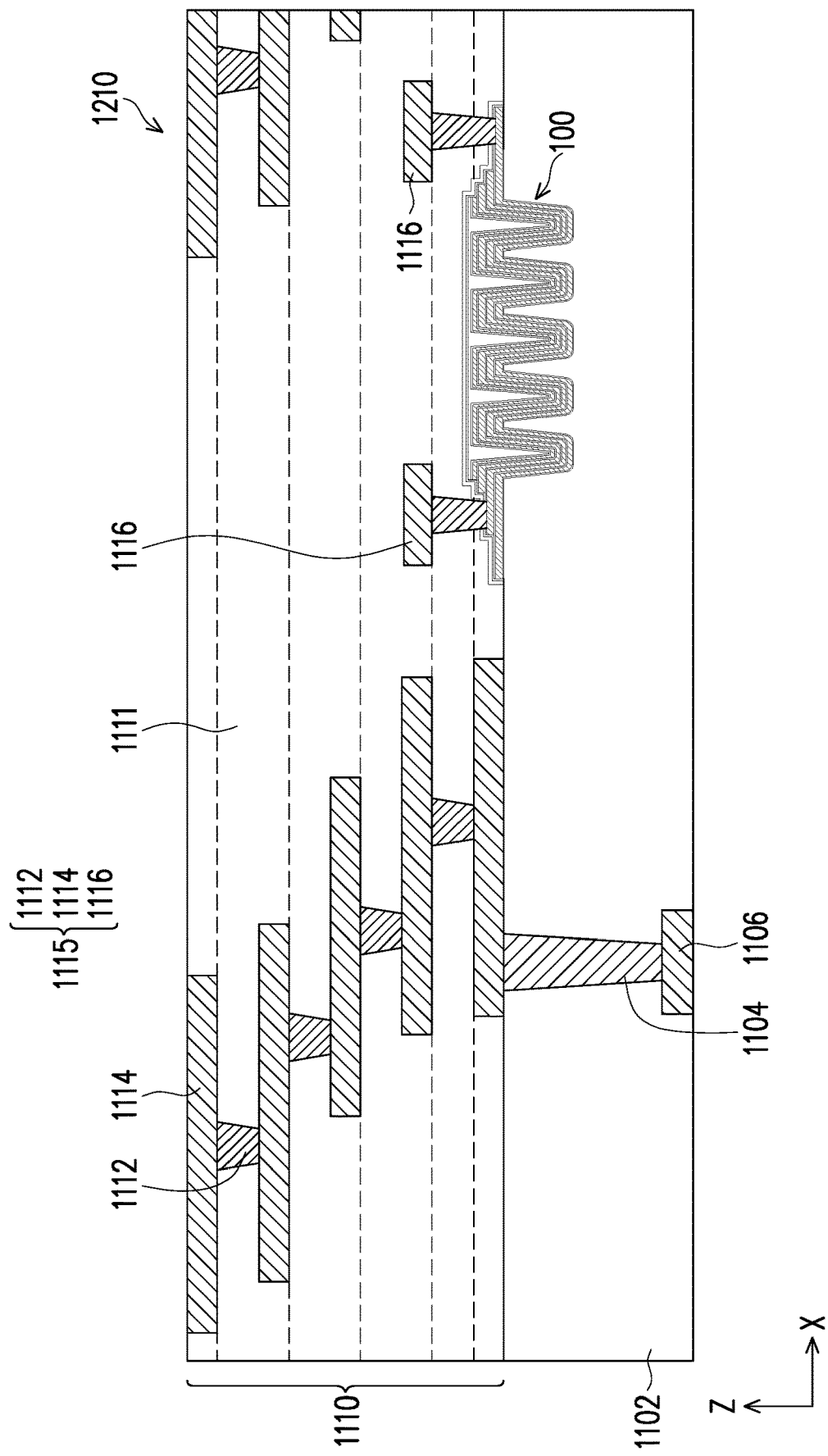
FIG. 11 is a cross-sectional view illustrating an interposer comprising a trench capacitor with capacitor segments and substrate segments in accordance with some embodiments.
Figure 12:
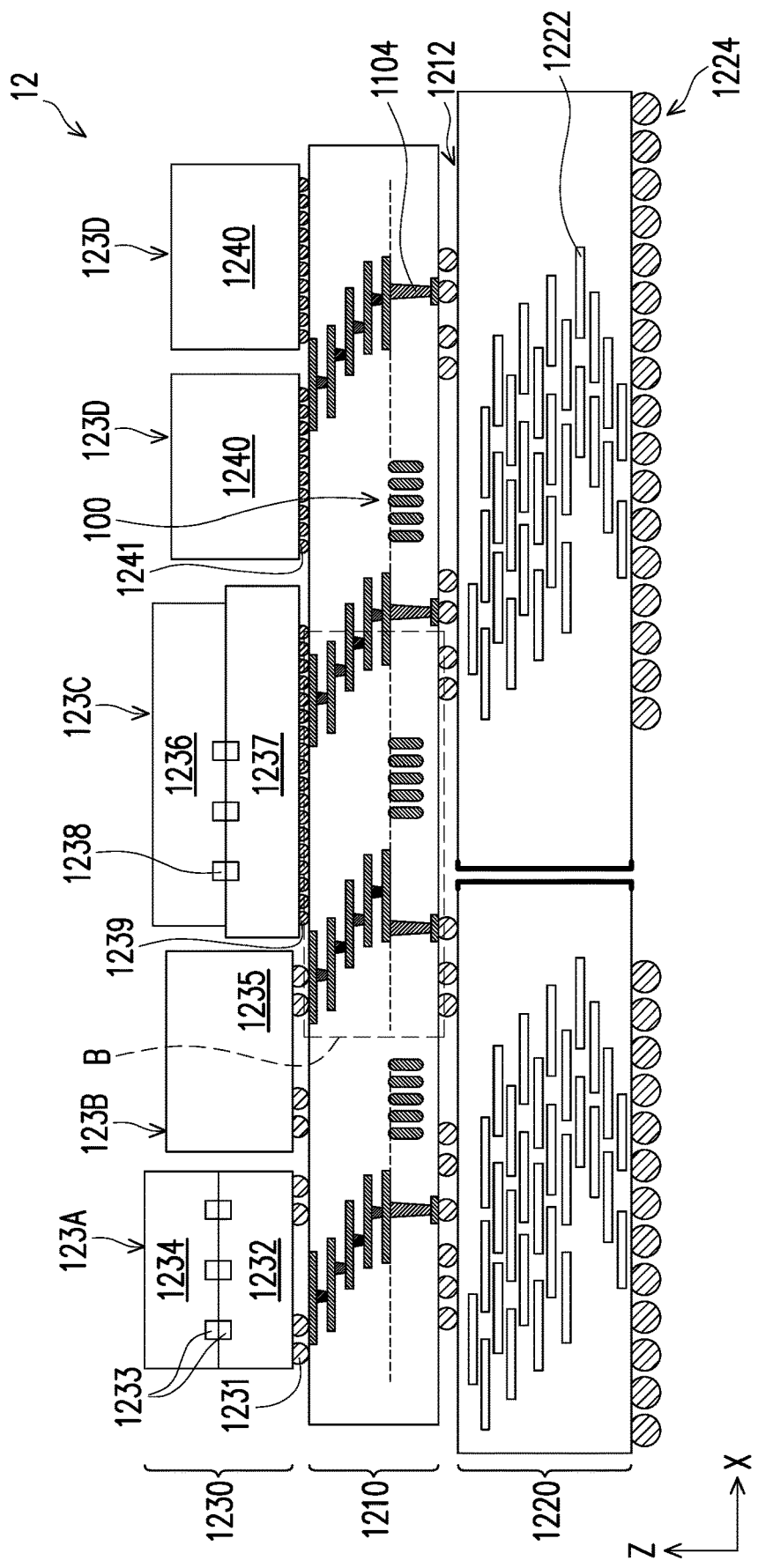
FIG. 12 illustrates a schematic cross-sectional view of a chip-on-wafer-on-substrate (CoWoS) package in accordance with some embodiments.

FIG. 12 illustrates a cross-sectional view of a chip-on-wafer-on-substrate (CoWoS) package comprising an interposer. A schematic enlarged view of a portion (box B) of the interposer (labeled as 1210) of FIG. 12 is shown in FIG. 11 in accordance with some embodiments. In FIG. 11, the interposer 1210 including a trench capacitor structure, and the trench capacitor structure is similar to the trench capacitor 100 of FIG. 1G with more capacitor segments and substrate segments in accordance with some embodiments.

Referring to FIG. 11, the interposer 1210 comprises an interposer substrate 1102, a through substrate via (TSV) 1104, a conductive feature 1106, and a redistribution structure 1110. The interposer substrate 1102 may include a semiconductor material (e.g. silicon) and may be formed from a semiconductor substrate (e.g. bulk wafer). In some embodiments, the TSV 1104, the conductive feature 1106 and the trench capacitors 100 are formed in the interposer substrate 1102. Further, the redistribution structure 1110 is formed on and over the interposer substrate 1102. The formation of the redistribution structure 1110 involves sequentially forming layers of dielectric materials 1111 and metallic patterns 1115 in alternation. In some embodiments, the metallic patterns 1115 of the redistribution structure 1110 include metallic lines 1114, vias 1112 stacked on the metallic lines 1114 and interconnecting the metallic lines 1114, and contacts 1116 connected to the trench capacitors 100.

In some embodiments, the redistribution structure 1110 overlies the interposer substrate 1102 and is electrically connected with the TSV 1104 and the trench capacitor(s) 100. The TSV 1104 is disposed on and electrically coupled to the conductive feature 1106. In some embodiments, through the TSV 1104, the conductive feature 1106, the metallic patterns 1115 including the vias 1112, the metallic lines 1114 and the contacts 1116, electrical connection paths are provided for the trench capacitor(s) 100 integrally formed in the interposer.

FIG. 12 provides a schematic view of the CoWoS package 12 to illustrate the relative configurations of the interposer 1210, the package circuit substrate 1220 and packages 1230 within the package 12.

Referring to FIG. 12, the interposer 1210 overlies and is electrically coupled to a package circuit substrate 1220 through first bump connectors 1212. In some embodiments, the first bump connectors 1212 include controlled collapse chip connection (C4) bumps or ball grid array (BGA) bumps. The package circuit substrate 1220 comprises a plurality conductive traces 1222 to provide electrical connection paths for connecting the above packages 1230 to outer electronic devices through the solder balls 1224. Further, the interposer 1210 electrically connects the above packages 1230 and the underlying package circuit substrate 1220. The packages 1230 includes packages 123A, 123B, 123C and 123D. In some embodiments, the package 123A includes semiconductor dies 1232, 1234 and the package 123A is electrically connected to the interposer 1210 through connectors 1231. The first and second semiconductor dies 1232 and 1234 are directly bonded through bond pads 1233. In some embodiments, the package 123B includes one or more semiconductor dies 1235 and is electrically connected to the interposer 1210 through connectors 1231. In some embodiments, the package 123D includes one or more semiconductor dies 1240 and is electrically connected to the interposer 1210 through connectors 1241. The connectors 1231 or 1241 include microbumps, metal posts or combinations thereof. In some embodiments, the package 123C includes semiconductor chiplets 1236, 1237, and the package 123C is electrically connected to the interposer 1210 through connectors 1239. The chiplets 1236 and 1237 are bonded through bond pads 1238. The packages 1230 for example, include one or more memory packages, stacked die packages, optical packages, RF packages etc. It is understood that the package 12 may be or include one or more SOC (system-on-chip) packages, MCM (multi-chip module) packages, SIP (system-in-package) packages, and/or SOP (system-on-package) packages. Alternatively, at least one of the packages 1230 may correspond to other suitable types of IC packages.

Figure 13A:
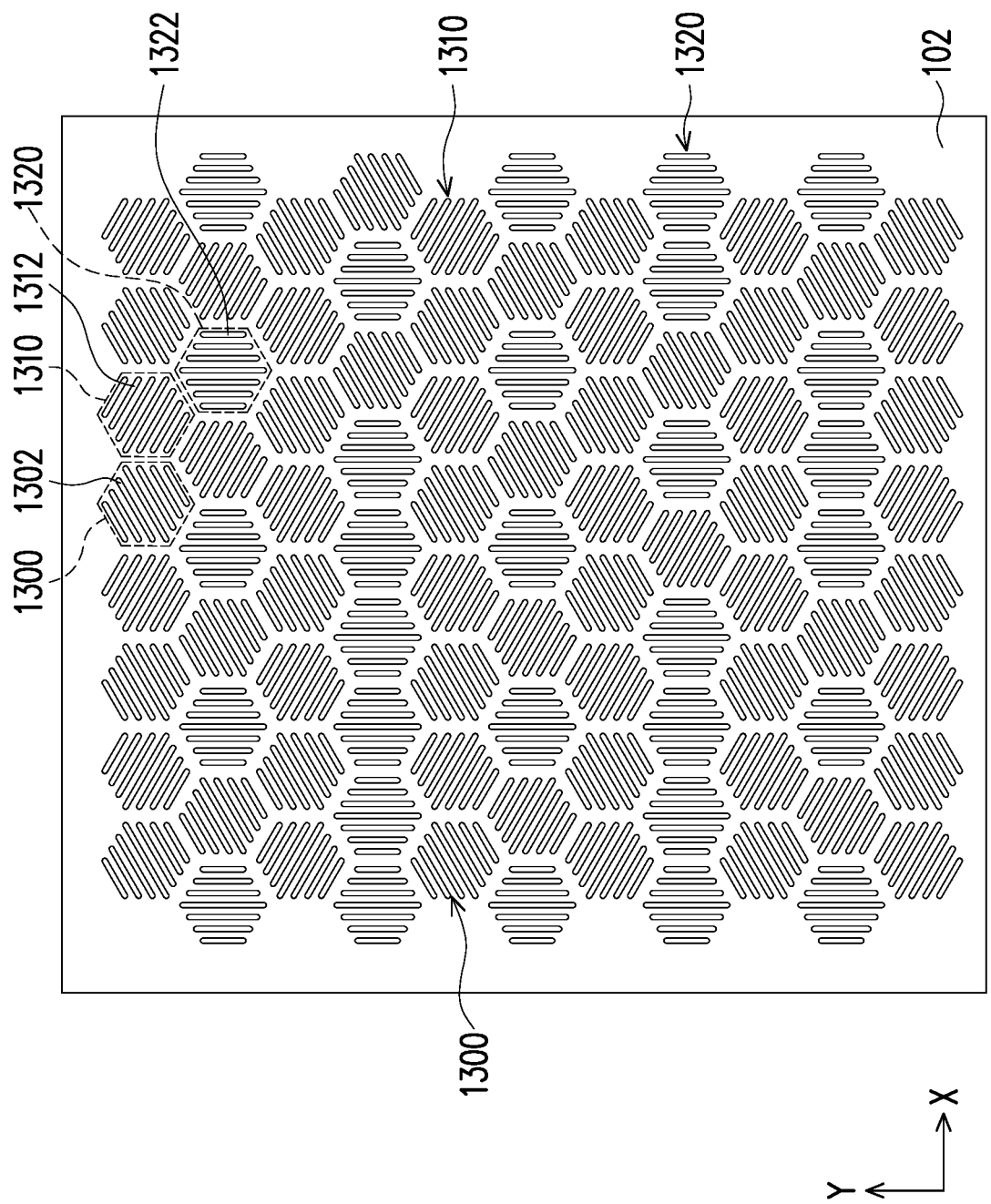
FIGS. 13A-13B are schematic top views illustrating exemplary layouts of a trench capacitor in accordance with some embodiments.
Figure 13B:
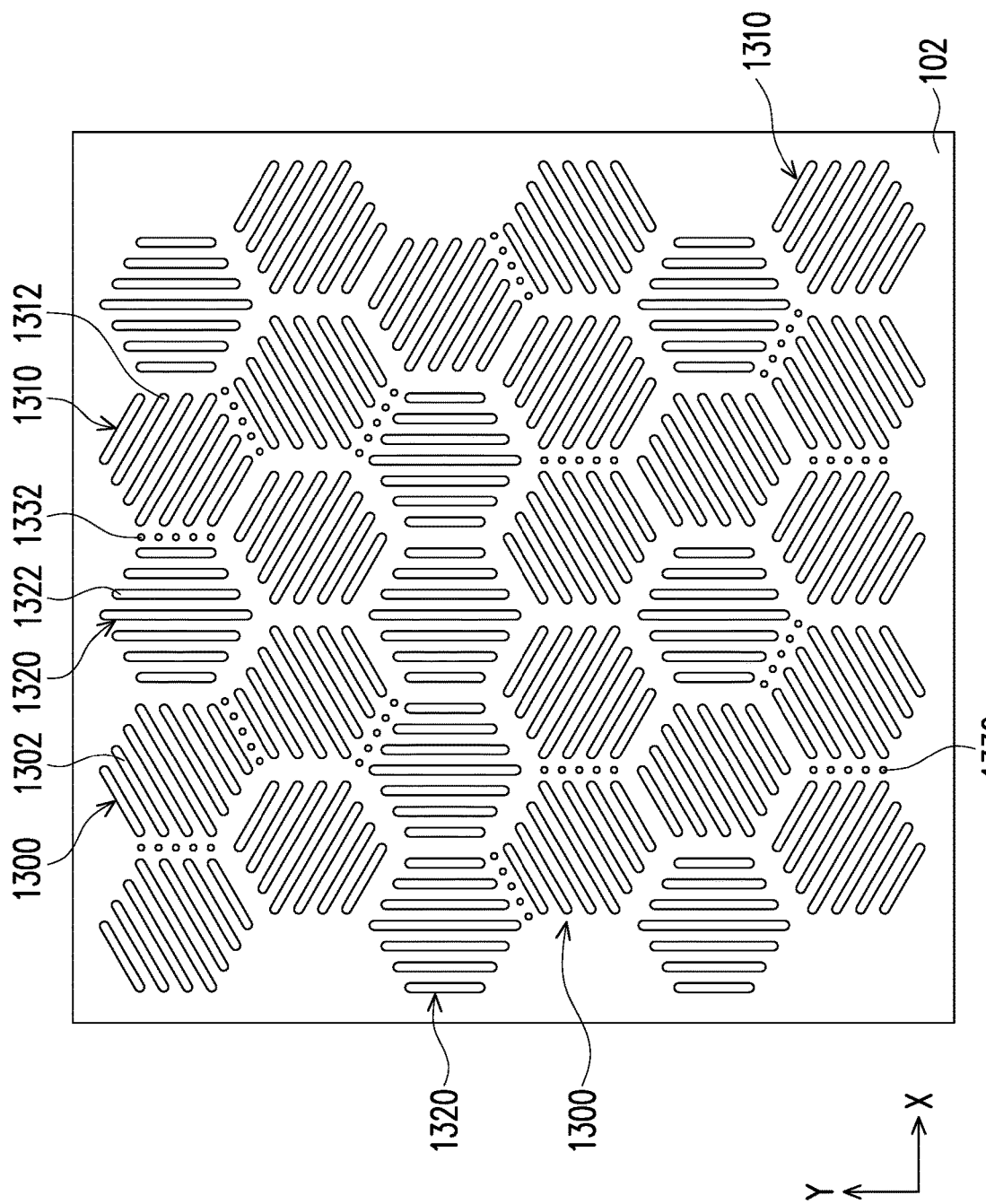

FIGS. 13A-13B are schematic top views illustrating exemplary layouts of the trench capacitor of FIG. 12 in accordance with some embodiments.

Referring to FIG. 13A, first unit cells 1300, second unit cells 1310, and third unit cells 1320 are provided. In some embodiments, the first unit cells 1300, the second unit cells 1310, and the third unit cells 1320 are arranged side-by-side in a random way. In alternative embodiments, the first unit cells 1300 and the second unit cells 1310 are arranged as an array in alternation.

In some embodiments, the unit cells 1300, 1310, and 1320 may respectively adopt the exemplary patterns of the unit cells as shown in any of FIGS. 3A-3C, 4, 5, 6A-6B, 7, 8A-8B, 9, and 10A-10B. For the two adjacent unit cells 1300, 1310, and 1320, there is an oblique angle between their arrangement directions or extension directions of the two adjacent unit cells, similar to the unit cells shown in FIGS. 3A-3C, 4, 5, and 9. As another example, first capacitor segments 1302 of the first unit cells 1300, second capacitor segments 1312 of the second unit cells 1310, and third capacitor segments 1322 of the third unit cells 1320 respectively have various lengths as shown in FIGS. 3A-3C, 4, 5, 6A-6B, 7, 8A-8B, 9, and 10A-10B.

Referring to FIG. 13B, FIG. 13B is a partial enlargement view of FIG. 13A. Conductive vias 1332 are disposed between two adjacent unit cells 1300, 1310, and 1320. In some embodiments, the conductive vias 1332 arranged along the outermost side of the capacitor segments 1302, 1312, or 1322. In alternative embodiments, the conductive vias 1332 arranged along end points of the capacitor segments 1302, 1312, or 1322.

Figure 14:
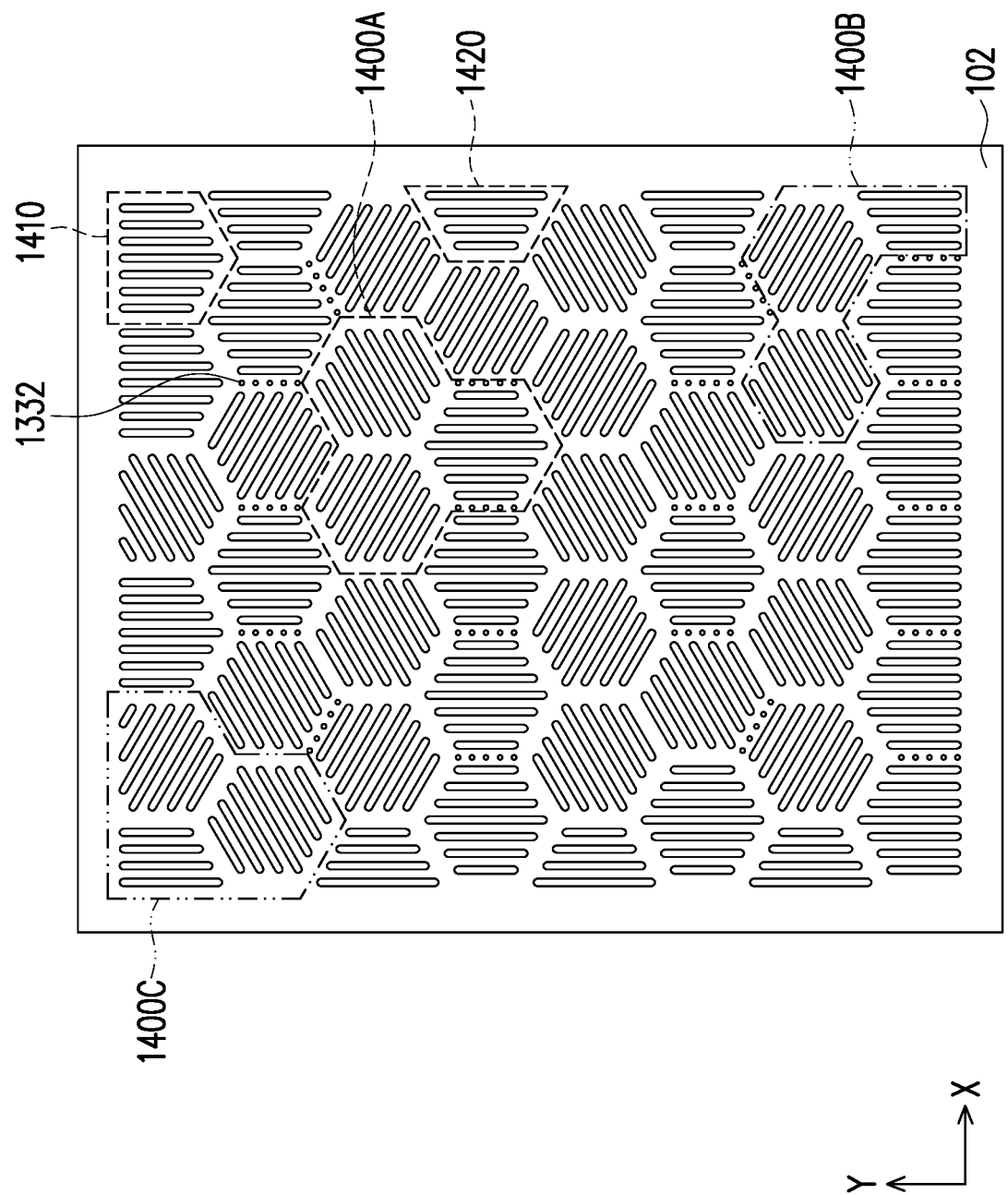
FIG. 14 is a schematic top view illustrating an exemplary layout of a trench capacitor in accordance with some alternative embodiments.
Figure 15A:
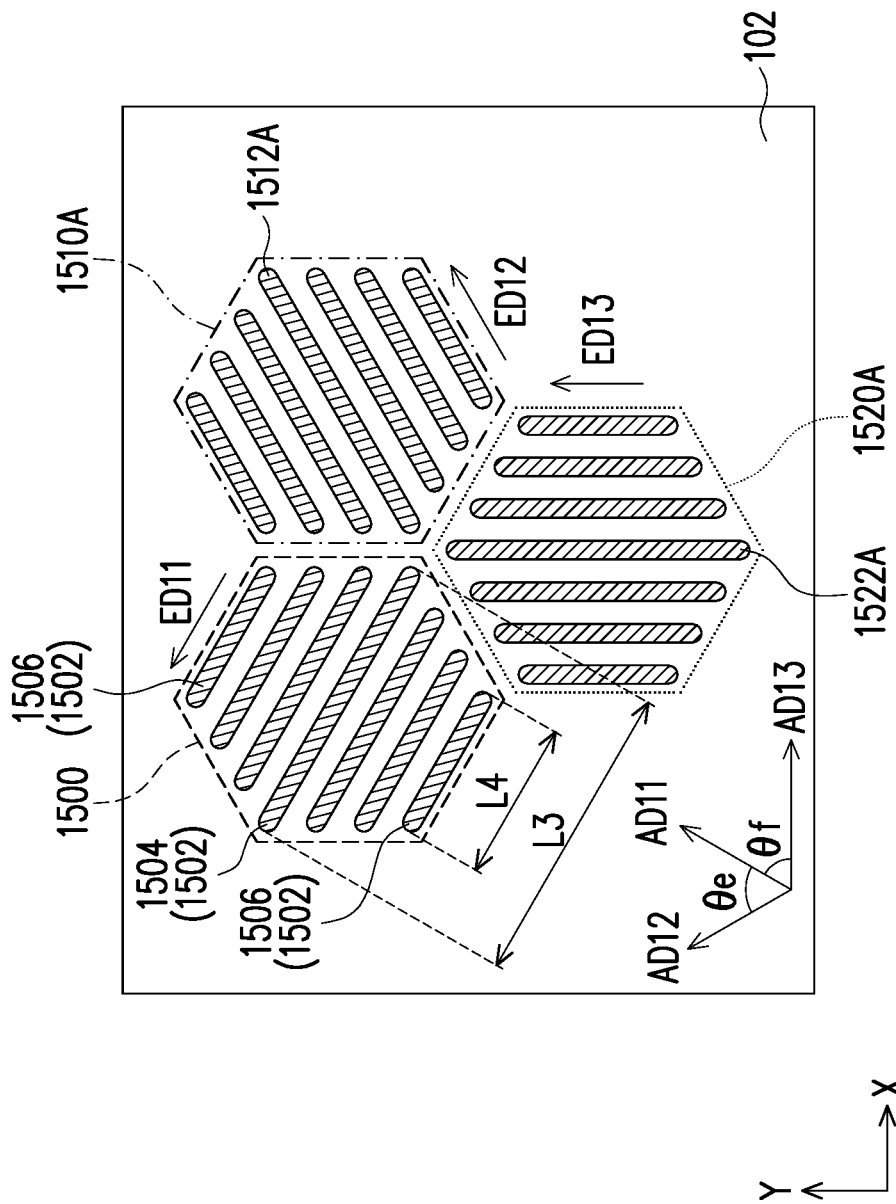
FIGS. 15A-15C are partial enlargement views of FIG. 14.
Figure 15B:
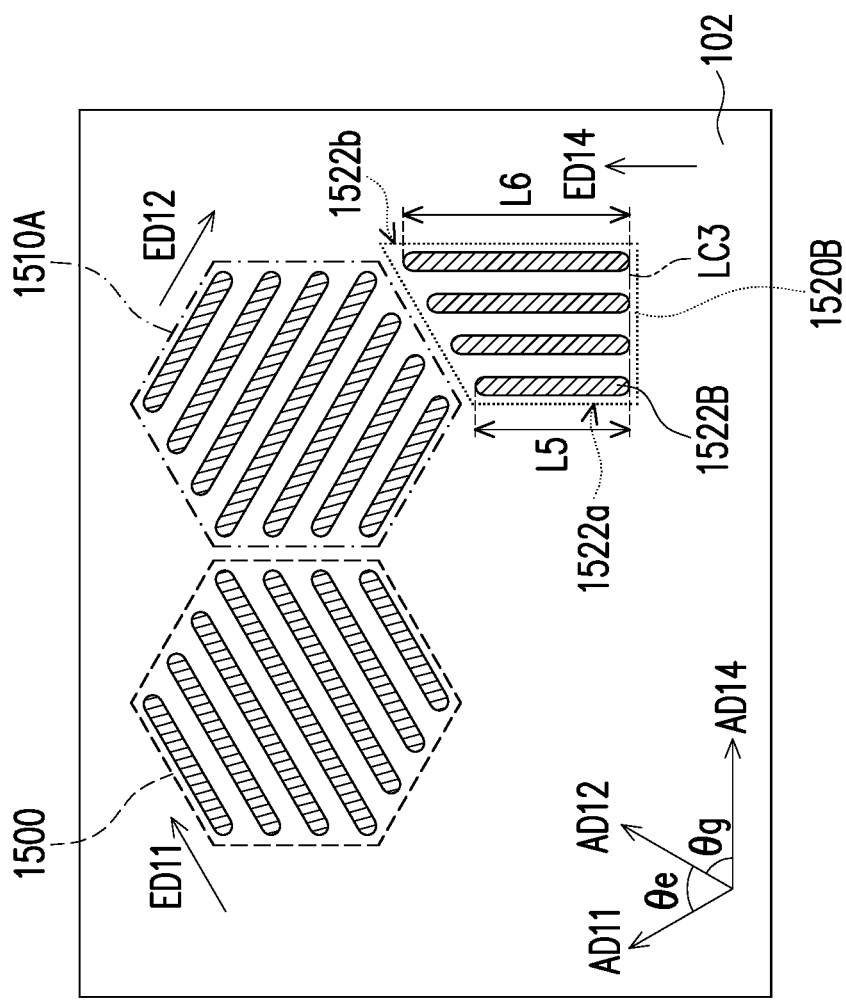
Figure 15C:
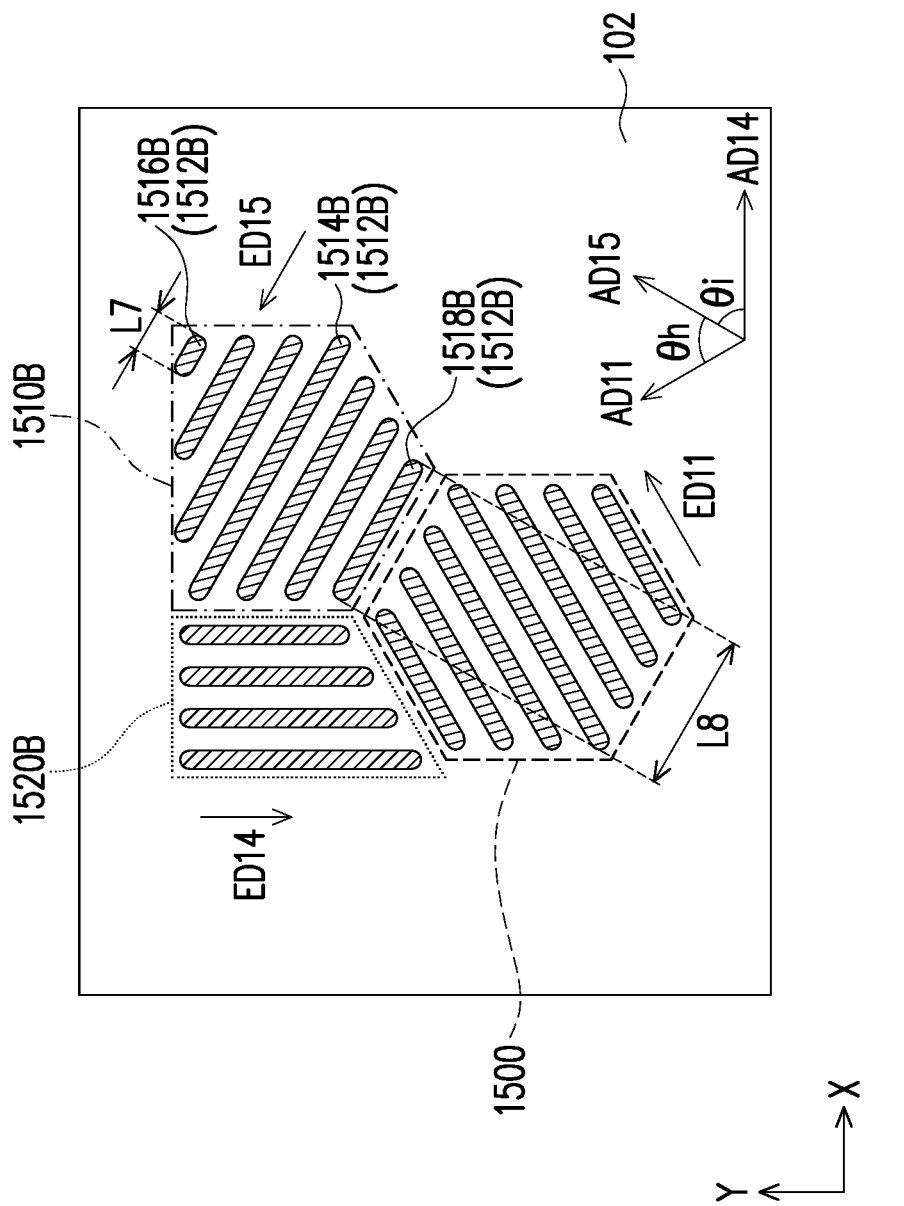

FIG. 14 is a schematic top view illustrating an exemplary layout of the trench capacitor of FIG. 12 in accordance with some alternative embodiments. FIGS. 15A-15C are partial enlargement views of FIG. 14.

Referring to FIG. 14, trench capacitors 1400A, 1400B, and 1400C are provided. In some embodiments, the trench capacitors 1400A, 1400B, and 1400C respectively are in multiple unit cells (three unit cells are shown). In some embodiments, the trench capacitors 1400A, 1400B and 1400C are arranged side-by-side in a random way. In alternative embodiments, the trench capacitors 1400A, 1400B and 1400C are arranged as an array in alternation. In some embodiments, auxiliary unit cells 1410 and 1420 are arranged to form smooth borders and meet the layout design requirement of the trench capacitor(s). The auxiliary unit cells 1410 and 1420 respectively have, for example, a pentagonal shape and a trapezoid shape.

Referring to FIG. 15A, FIG. 15A illustrate the layout of the trench capacitor 1400A of FIG. 14. The trench capacitor 1400A is in a first unit cell 1500, a second unit cell 1510A, and a third unit cell 1520A. In some embodiments, the first unit cell 1500, the second unit cell 1510A, and the third unit cell 1520A have a hexagonal shape.

In the first unit cell 1500, first capacitor segments 1502 include separate segments of different extending lengths arranged in parallel. Each of the first capacitor segments 1502 extends along a first extension direction ED11. The first capacitor segments 1502 are spaced apart and arranged parallel to each other in a first arrangement direction AD11. In some embodiments, the first arrangement direction AD11 is perpendicular to the first extension direction ED11.

In the second unit cell 1510A, second capacitor segments 1512A include separate segments of different extending lengths arranged in parallel. Each of the second capacitor segments 1512A extends along a second extension direction ED12. The second capacitor segments 1512A are spaced apart and arranged parallel to each other in a second arrangement direction AD12. In some embodiments, the second arrangement direction AD12 is perpendicular to the second extension direction ED12.

In the third unit cell 1520A, third capacitor segments 1522A include separate segments of different extending lengths arranged in parallel. Each of the third capacitor segments 1522A extends along a third extension direction ED13. The third capacitor segments 1522A are spaced apart and arranged parallel to each other in a third arrangement direction AD13. In some embodiments, the third arrangement direction AD13 is perpendicular to the third extension direction ED13.

As seen in FIG. 15A, the arrangement directions AD11 and AD12 are obliquely intersected and an angle θe between the first arrangement direction AD11 and the second arrangement direction AD12 is an acute angle. The arrangement directions AD11 and AD13 are obliquely intersected and an angle θf between the first arrangement direction AD11 and the third arrangement direction AD13 is an acute angle. In some embodiments, a sum of the angle θe and the angle θf is, for example, greater than the 90 degrees. In some embodiments, any two of the first extension direction ED11, the second extension direction ED12 and the third extension direction ED13 are obliquely intersected. In some embodiments, the first unit cell 1500 is adjacent to the second unit cell 1510A and the third unit cell 1520A. In further embodiments, the first unit cell 1500, the second unit cell 1510A and the third unit cell 1520A are located on the semiconductor substrate 102 in the manner of side-by-side.

One of the capacitor segments 1502, 1512A and 1522A has an extending length different from that of another of the capacitor segments 1502, 1512A and 1522A. In some embodiments, the first capacitor segments 1502 include a first middle segment 1504 at the middle of the first unit cell 1500 and two first outer segments 1506 at the outermost sides of the first unit cell 1500. The first middle segment 1504 has the longest extending length L3. In one embodiment, the first outer segments 1506 respectively have substantially the same and the shortest extending length L4. In other words, the extending length L3 of the first middle segment 1504 is greater than the extending length L4 of the first outer segments 1506. In further embodiments, extending lengths of the first capacitor segments 1502 are gradually decreased from the first middle segment 1504 to one or two of the first outer segments 1506. Similar to the first unit cell 1500, extending lengths of the second capacitor segments 1512A of the second unit cell 1510A are gradually decreased from the middle to the outermost sides of the second unit cell 1510A, and extending lengths of the third capacitor segments 1522A of the third unit cell 1520A are gradually decreased from the middle to the outermost sides of the third unit cell 1520A.

Referring to FIG. 15B, FIG. 15B illustrates a layout of the trench capacitor 1400B of FIG. 14. The trench capacitor 1400B is in the first unit cell 1500, the second unit cell 1510A, and a third unit cell 1520B. In some embodiments, the third unit cell 1520B have a right trapezoid shape.

In the third unit cell 1520B, third capacitor segments 1522B include separate segments of different extending lengths arranged in parallel. Each of the third capacitor segments 1522B extends along a third extension direction ED14. The third capacitor segments 1522B are spaced apart and arranged parallel to each other in a third arrangement direction AD14. In some embodiments, the third arrangement direction AD14 is perpendicular to the third extension direction ED14.

As seen in FIG. 15B, the arrangement directions AD12 and AD14 are obliquely intersected and an angle θg between the second arrangement direction AD12 and the third arrangement direction AD14 is an acute angle. In some embodiments, a sum of the angle θe and the angle θg is, for example, greater than the 90 degrees. In some embodiments, any two of the first extension direction ED11, the second extension direction ED12 and the third extension direction ED14 are obliquely intersected. In some embodiments, the third unit cell 1520B is adjacent to the second unit cell 1510A. In further embodiments, the first unit cell 1500, the second unit cell 1510A and the third unit cell 1520B are located on the semiconductor substrate 102 in the manner of side-by-side.

In some embodiments, one of the third capacitor segments 1522B has an extending length different from that of another of third capacitor segments 1522B. The third unit cell 1520B includes edges 1522a and 1522b, wherein the edge 1522b is an edge opposite to the edge 1522a in the third arrangement direction AD14. In some embodiments, the outermost third capacitor segment 1522B at an edge 1522a has an extending length L5 less than an extending length L6 of the outermost third capacitor segment 1522B at an edge 1522b. In further embodiments, extending lengths of the third capacitor segments 1522B are gradually increased from the edge 1522a to an edge 1522b of the third unit cell 1520B in the third arrangement direction AD14. In some embodiments, lines connecting the end points of the third capacitor segments 1522B (as the dashed line LC3) is parallel to the third arrangement direction AD14.

Referring to FIG. 15C, FIG. 15C illustrate the layout of the trench capacitor 1400C of FIG. 14. The trench capacitor 1400C is in the first unit cell 1500, a second unit cell 1510B, and the third unit cell 1520B. In some embodiments, the second unit cell 1510B have a pentagonal and asymmetry shape.

In the second unit cell 1510B, second capacitor segments 1512B include separate segments of different extending lengths arranged in parallel. Each of the second capacitor segments 1512B extends along a second extension direction ED15. The second capacitor segments 1512B are spaced apart and arranged parallel to each other in a second arrangement direction AD15. In some embodiments, the second arrangement direction AD15 is perpendicular to the second extension direction ED15.

As seen in FIG. 15C, the arrangement directions AD11 and AD15 are obliquely intersected and an angle θh between the first arrangement direction AD11 and the second arrangement direction AD15 is an acute angle. The arrangement directions AD15 and AD14 are obliquely intersected and an angle θi between the second arrangement direction AD15 and the third arrangement direction AD14 is an acute angle. In one embodiment, a sum of the angle θh and the angle θi is, for example, greater than the 90 degrees. In some embodiments, any two of the first extension direction ED11, the second extension direction ED15 and the third extension direction ED14 are obliquely intersected. In some embodiments, the first unit cell 1500 is adjacent to the second unit cell 1510B and the third unit cell 1520B. In further embodiments, the first unit cell 1500, the second unit cell 1510B and the third unit cell 1520B are located on the semiconductor substrate 102 in the manner of side-by-side.

One of the second capacitor segments 1512B has an extending length different from that of another of the second capacitor segments 1512B. In some embodiments, the second capacitor segments 1512B include a second middle segment 1514B at the middle of the second unit cell 1510B and second outer segments 1516B and 1518B located respectively at the outermost sides of the second unit cell 1510B. The second middle segment 1514B has the longest extending length. In some embodiments, an extending length L7 of the second outer segment 1516B is less than an extending length L8 of the second outer segment 1518B. In further embodiments, extending lengths of the second capacitor segments 1512B are gradually decreased from the second middle segment 1514B to second outer segments 1516B and 1518B.

A package structure having a trench capacitor are provided. The embodiments of the present disclosure have some advantageous features. In accordance with some embodiments of the present disclosure, the semiconductor substrate may have at least two groups of trenches therein, wherein a group of trenches are arranged in parallel in an arrangement direction with each trench extending in an extension direction. In some embodiments, the arrangement directions or extension directions of any two groups of trenches are intersected. Trench capacitors are respectively disposed in a corresponding group of trenches and on the semiconductor substrate. Each trench capacitor includes capacitor segments disposed inside the corresponding group of trenches and extending inside the semiconductor substrate in a corresponding extension direction. One of the capacitor segments has an extending length different from that of another of the capacitor segments. Through the layout design and the arrangement of the capacitor segments, mechanical stress in the semiconductor substrate may be relieved, less cracking occurs in the semiconductor substrate and warpage of the package structure is improved. Further, higher integration density can be achieved and larger capacitance is offered through the compact layout design of the trench capacitor(s), leading to better device performance.

In accordance with some embodiments of the present disclosure, a semiconductor structure comprises a semiconductor substrate, a first trench capacitor, and a second trench capacitor. The semiconductor substrate has first trenches and second trenches therein. The first trenches are separate trenches and arranged in parallel in a first arrangement direction with each first trench extending in a first extension direction. The second trenches are separate trenches and arranged in parallel in a second arrangement direction with each second trench extending in a second extension direction. The first extension direction is intersected with the second extension direction, and the first arrangement direction is intersected with the second arrangement direction. The first trench capacitor disposed in the first trenches and on the semiconductor substrate. The first trench capacitor includes first capacitor segments disposed inside the first trenches and extending inside the semiconductor substrate in the first extension direction. The second trench capacitor disposed in the second trenches and on the semiconductor substrate. The second trench capacitor includes second capacitor segments disposed inside the second trenches and extending inside the semiconductor substrate in the second extension direction. One first capacitor segment of the first capacitor segments has an extending length different from that of another first capacitor segment of the first capacitor segments, and one second capacitor segment of the second capacitor segments has an extending length different from that of another second capacitor segment of the second capacitor segments.

In accordance with some embodiments of the present disclosure, a package structure comprises a package circuit substrate, an interposer disposed on the package circuit substrate, and a package disposed on the interposer. The interposer comprises an interposer substrate, through substrate vias formed in the interposer substrate, and a first trench capacitor and a second trench capacitor respectively disposed beside the through substrate vias. The package is electrically connected with the package circuit substrate through the through substrate vias of the interposer. The interposer substrate has first trenches and second trenches therein. The first trenches are separate trenches and arranged in parallel in a first arrangement direction with each first trench extending in a first extension direction. The second trenches are separate trenches and arranged in parallel in a second arrangement direction with each second trench extending in a second extension direction. The first extension direction is intersected with the second extension direction, and the first arrangement direction is intersected with the second arrangement direction. The first trench capacitor disposed in the first trenches and includes first capacitor segments disposed inside the first trenches and extending inside the interposer substrate in the first extension direction. The second trench capacitor disposed in the second trenches and includes second capacitor segments disposed inside the second trenches and extending inside the semiconductor substrate in the second extension direction. An angle between the first arrangement direction and the second arrangement direction is an oblique angle, and one first capacitor segment of the first capacitor segments has an extending length different from that of another first capacitor segment of the first capacitor segments, or one second capacitor segment of the second capacitor segments has an extending length different from that of another second capacitor segment of the second capacitor segments.

In accordance with some embodiments of the present disclosure, a semiconductor structure comprises a semiconductor substrate, a first trench capacitor, a second trench capacitor, and a third trench capacitor. The semiconductor substrate has first trenches, second trenches and third trenches therein. The first trenches are separate trenches and arranged in parallel in a first arrangement direction with each first trench extending in a first extension direction. The second trenches are separate trenches and arranged in parallel in a second arrangement direction with each second trench extending in a second extension direction. The third trenches are separate trenches and arranged in parallel in a third arrangement direction with each third trench extending in a third extension direction. The first extension direction is intersected with the second extension direction and the third extension direction, and the first arrangement direction is intersected with the second arrangement direction and third arrangement direction. The first trench capacitor disposed in the first trenches and on the semiconductor substrate. The first trench capacitor includes first capacitor segments disposed inside the first trenches and extending inside the semiconductor substrate in the first extension direction. The second trench capacitor disposed in the second trenches and on the semiconductor substrate. The second trench capacitor includes second capacitor segments disposed inside the second trenches and extending inside the semiconductor substrate in the second extension direction. The third trench capacitor disposed in the third trenches and on the semiconductor substrate. The third trench capacitor includes third capacitor segments disposed inside the third trenches and extending inside the semiconductor substrate in the third extension direction. An angle between two of the first arrangement direction, the second arrangement direction and the third arrangement direction is an oblique angle, one first capacitor segment of the first capacitor segments has an extending length different from that of another first capacitor segment of the first capacitor segments, one second capacitor segment of the second capacitor segments has an extending length different from that of another second capacitor segment of the second capacitor segments, and one third capacitor segment of the third capacitor segments has an extending length different from that of another third capacitor segment of the third capacitor segments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a semiconductor substrate having first trenches and second trenches therein, wherein the first trenches are separate trenches and arranged in parallel in a first arrangement direction with each first trench extending in a first extension direction, the second trenches are separate trenches and arranged in parallel in a second arrangement direction with each second trench extending in a second extension direction, the first extension direction is intersected with the second extension direction, and the first arrangement direction is intersected with the second arrangement direction with an angle between the first arrangement direction and the second arrangement direction being an oblique angle;
a first trench capacitor disposed in the first trenches and on the semiconductor substrate, wherein the first trench capacitor includes first capacitor segments disposed inside the first trenches and extending inside the semiconductor substrate in the first extension direction; and
a second trench capacitor disposed in the second trenches and on the semiconductor substrate, wherein the second trench capacitor includes second capacitor segments disposed inside the second trenches and extending inside the semiconductor substrate in the second extension direction,
wherein one first capacitor segment of the first capacitor segments has an extending length different from that of another first capacitor segment of the first capacitor segments, and one second capacitor segment of the second capacitor segments has an extending length different from that of another second capacitor segment of the second capacitor segments.

2. The semiconductor structure as claimed in claim 1, wherein
at least two first capacitor segments of the first capacitor segments have a same extending length, and
at least two second capacitor segments of the second capacitor segments have a same extending length.

3. The semiconductor structure as claimed in claim 1, wherein the first capacitor segments or the second capacitor segments are arranged in an array, and outermost capacitor segments of the array have shortest extending lengths.

4. The semiconductor structure as claimed in claim 1, wherein the first capacitor segments or the second capacitor segments are arranged in an array, a middle capacitor segment of the array has the longest extending length.

5. The semiconductor structure as claimed in claim 1, wherein the first capacitor segments or the second capacitor segments are arranged in an array, a middle capacitor segment of the array has the shortest extending length.

6. The semiconductor structure as claimed in claim 1, wherein the first capacitor segments or the second capacitor segments are arranged in an array, at least two middle capacitor segments of the array have a same extending length.

7. The semiconductor structure as claimed in claim 1, wherein the first capacitor segments or the second capacitor segments are arranged in an array, and one outermost capacitor segment of the array has an extending length less than that of another outermost capacitor segment of the array.

8. The semiconductor structure as claimed in claim 1, wherein the angle between the first arrangement direction and the second arrangement direction is an acute angle.

9. A package structure, comprising:
a package circuit substrate;
an interposer disposed on the package circuit substrate, wherein the interposer comprises an interposer substrate, through substrate vias formed in the interposer substrate, and a first trench capacitor and a second trench capacitor respectively disposed beside the through substrate vias; and
a package, disposed on the interposer and electrically connected with the package circuit substrate through the through substrate vias of the interposer,
wherein the interposer substrate has first trenches and second trenches therein, wherein the first trenches are separate trenches and arranged in parallel in a first arrangement direction with each first trench extending in a first extension direction, the second trenches are separate trenches and arranged in parallel in a second arrangement direction with each second trench extending in a second extension direction, the first extension direction is intersected with the second extension direction, and the first arrangement direction is intersected with the second arrangement direction;
wherein the first trench capacitor disposed in the first trenches and includes first capacitor segments disposed inside the first trenches and extending inside the interposer substrate in the first extension direction,
wherein the second trench capacitor disposed in the second trenches and includes second capacitor segments disposed inside the second trenches and extending inside the interposer substrate in the second extension direction,
wherein an angle between the first arrangement direction and the second arrangement direction is an oblique angle, and one first capacitor segment of the first capacitor segments has an extending length different from that of another first capacitor segment of the first capacitor segments, or one second capacitor segment of the second capacitor segments has an extending length different from that of another second capacitor segment of the second capacitor segments.

10. The package structure as claimed in claim 9, wherein at least two first capacitor segments of the first capacitor segments have a same extending length, or
at least two second capacitor segments of the second capacitor segments have a same extending length.

11. The package structure as claimed in claim 9, wherein the first capacitor segments or the second capacitor segments are arranged in an array, and outermost capacitor segments of the array have shortest extending lengths.

12. The package structure as claimed in claim 9, wherein the first capacitor segments or the second capacitor segments are arranged in an array, a middle capacitor segment of the array has the longest extending length.

13. The package structure as claimed in claim 9, wherein the first capacitor segments or the second capacitor segments are arranged in an array, at least two middle capacitor segments of the array have a same extending length.

14. The package structure as claimed in claim 9, wherein the first capacitor segments or the second capacitor segments are arranged in an array, and one outermost capacitor segment of the array has an extending length less than that of another outermost capacitor segment of the array.

15. The package structure as claimed in claim 9, wherein the interposer further comprises a redistribution structure disposed on the interposer substrate and comprising conductive vias, wherein
in a top-view of the interposer substrate, the conductive vias are disposed between the first trench capacitor and the second trench capacitor, wherein the first trench capacitor is adjacent to the second trench capacitor.

16. Semiconductor structure, comprising:
a semiconductor substrate having first trenches, second trenches and third trenches therein, wherein the first trenches are separate trenches and arranged in parallel in a first arrangement direction with each first trench extending in a first extension direction, the second trenches are separate trenches and arranged in parallel in a second arrangement direction with each second trench extending in a second extension direction, the third trenches are separate trenches and arranged in parallel in a third arrangement direction with each third trench extending in a third extension direction, the first extension direction is intersected with the second extension direction and the third extension direction, and the first arrangement direction is intersected with the second arrangement direction and the third arrangement direction;
a first trench capacitor disposed in the first trenches and on the semiconductor substrate, wherein the first trench capacitor includes first capacitor segments disposed inside the first trenches and extending inside the semiconductor substrate in the first extension direction;
a second trench capacitor disposed in the second trenches and on the semiconductor substrate, wherein the second trench capacitor includes second capacitor segments disposed inside the second trenches and extending inside the semiconductor substrate in the second extension direction; and
a third trench capacitor disposed in the third trenches and on the semiconductor substrate, wherein the third trench capacitor includes third capacitor segments disposed inside the third trenches and extending inside the semiconductor substrate in the third extension direction,
wherein an angle between two of the first arrangement direction, the second arrangement direction and the third arrangement direction is an oblique angle, one first capacitor segment of the first capacitor segments has an extending length different from that of another first capacitor segment of the first capacitor segments, one second capacitor segment of the second capacitor segments has an extending length different from that of another second capacitor segment of the second capacitor segments, and one third capacitor segment of the third capacitor segments has an extending length different from that of another third capacitor segment of the third capacitor segments.

17. The semiconductor structure as claimed in claim 16, wherein at least two first capacitor segments of the first capacitor segments have a same extending length,
at least two second capacitor segments of the second capacitor segments have a same extending length, and
at least two third capacitor segments of the third capacitor segments have a same extending length.

18. The semiconductor structure as claimed in claim 16, wherein the first capacitor segments, the second capacitor segments or the third capacitor segments are arranged in an array, a middle capacitor segment of the array has the longest extending length.

19. The semiconductor structure as claimed in claim 16, wherein the first capacitor segments, the second capacitor segments or the third capacitor segments are arranged in an array, and one outermost capacitor segment of the array has an extending length less than that of another outermost capacitor segment of the array.

20. The semiconductor structure as claimed in claim 16, wherein the first trench capacitor, the second trench capacitor and the third trench capacitor are bordering.

\* \* \* \* \*